US009096441B2

(12) United States Patent
Inaba et al.

(10) Patent No.: US 9,096,441 B2
(45) Date of Patent: Aug. 4, 2015

(54) COMPOSITION FOR MANUFACTURING DOPED OR UNDOPED ZINC OXIDE THIN FILM AND METHOD FOR MANUFACTURING ZINC OXIDE THIN FILM USING SAME

(75) Inventors: Koichiro Inaba, Yamaguchi (JP); Kouji Toyota, Yamaguchi (JP); Kenichi Haga, Yamaguchi (JP); Kouichi Tokudome, Yamaguchi (JP)

(73) Assignee: TOSOH FINECHEM CORPORATION, Yamaguchi (JP)

( * ) Notice: Subject to any disclaimer, the term of this patent is extended or adjusted under 35 U.S.C. 154(b) by 213 days.

(21) Appl. No.: 13/265,544

(22) PCT Filed: Apr. 21, 2010

(86) PCT No.: PCT/JP2010/057071
§ 371 (c)(1),
(2), (4) Date: Dec. 27, 2011

(87) PCT Pub. No.: WO2010/123030
PCT Pub. Date: Oct. 28, 2010

(65) Prior Publication Data
US 2012/0094019 A1 Apr. 19, 2012

(30) Foreign Application Priority Data

Apr. 21, 2009 (JP) .................................. 2009-102544
Aug. 27, 2009 (JP) .................................. 2009-197052
Feb. 16, 2010 (JP) .................................. 2010-030914

(51) Int. Cl.
*C01G 9/02* (2006.01)
*H01L 31/18* (2006.01)

(52) U.S. Cl.
CPC .............. *C01G 9/02* (2013.01); *H01L 31/1884* (2013.01); *C01P 2002/50* (2013.01); *C01P 2002/52* (2013.01); *C01P 2002/72* (2013.01); *C01P 2002/86* (2013.01); *C01P 2006/40* (2013.01); *C01P 2006/42* (2013.01); *C01P 2006/60* (2013.01); *Y02E 10/50* (2013.01)

(58) Field of Classification Search
CPC ... C01G 9/02; H01L 31/1884; C01P 2002/50; C01P 2006/60; Y02E 10/50
USPC .................................................... 106/287.17
See application file for complete search history.

(56) References Cited

U.S. PATENT DOCUMENTS

| 2006/0275948 | A1  | 12/2006 | Takamatsu et al. |         |
|--------------|-----|---------|------------------|---------|
| 2008/0032443 | A1* | 2/2008  | Wu et al.        | 438/104 |
| 2008/0210973 | A1  | 9/2008  | Chen et al.      |         |
| 2008/0224133 | A1  | 9/2008  | Park et al.      |         |

FOREIGN PATENT DOCUMENTS

| CN | 101130860   | 2/2008  |
|----|-------------|---------|
| EP | 1728893 A2  | 12/2006 |
| GB | 2355991     | 5/2001  |
| JP | 38-06646    | 5/1963  |
| JP | 38-26099    | 12/1963 |
| JP | S62-263138  | 11/1987 |
| JP | H05-294623  | 11/1993 |
| JP | 05-330823   | 12/1993 |
| JP | 06-041151   | 2/1994  |
| JP | 07-182939   | 7/1995  |
| JP | 2000-058890 | 2/2000  |
| JP | 2001-131217 | 5/2001  |
| JP | 2001-131444 | 5/2001  |
| JP | 2003-054947 | 2/2003  |
| JP | 2004-149390 | 5/2004  |
| JP | 2004-256377 | 9/2004  |
| JP | 2005-170754 | 6/2005  |
| JP | 2005-305367 | 11/2005 |
| JP | 2006-336062 | 12/2006 |
| JP | 2008-143771 | 6/2008  |
| JP | 2008-201825 | 9/2008  |
| JP | 2008-252075 | 10/2008 |
| JP | 2010-126402 | 6/2010  |

(Continued)

OTHER PUBLICATIONS

Wieldraaijer et al "Metalorganic Chemical Vapour Deposition of Zinc Oxide from Dimethylzinc, water, and tetrahydrofuran" J. or Crystal Growth 126 (1993) 305-308.*
Souletie et al, "Growth kinetics of ZnO prepared by organometallic chemical vapor deposition", J Mater, Res., vol. 3, No. 4, (Aug. 1988) pp. 740-744.*
The Japan Society for the Promotion of Science, "Transparent Oxide Photoelectron Materials", Compiled by the 166th Committee, Transparent Conductive Film Technologies, 2nd Rev. Ed. (2006), pp. 165-173.

(Continued)

*Primary Examiner* — David M Brunsman
(74) *Attorney, Agent, or Firm* — Ditthavong & Steiner, P.C.

(57) ABSTRACT

Disclosed is a composition for forming a zinc oxide thin film, which contains an organic zinc compound as a starting material, is not ignitable, and can be easily handled. The composition for forming a zinc oxide thin film is capable of forming a transparent zinc oxide thin film which is not doped or doped with a group 3B element by being heated at 300° C. or less. Also disclosed is a method for obtaining a transparent zinc oxide thin film, which is not doped or doped with a group 3B element, using the composition. Specifically, the composition for forming a zinc oxide thin film contains a product which is obtained by partially hydrolyzing an organic zinc compound by adding water to the organic zinc compound or a solution of the organic zinc compound and a group 3B element compound. In cases when a group 3B element compound is contained, the molar ratio of the group 3B element compound to the organic zinc compound is within the range of 0.005-0.3. The composition is applied to a substrate surface and then heated, thereby forming a zinc oxide thin film which is doped with the group 3B element.

10 Claims, 11 Drawing Sheets

(56) References Cited

FOREIGN PATENT DOCUMENTS

| JP | 2011-170979 | 9/2011 |
|---|---|---|
| KR | 100876947 B1 | 1/2009 |

OTHER PUBLICATIONS

K. Sorab et al., "Highly oriented zinc oxide films grown by the oxidation of diethylzinc", Appl. Phys. Lett., 37(5), Sep. 1, 1980, pp. 449-451.

J. Aranovich et al., "Optical and electrical properties of ZnO films prepared by spray pyrolysis for solar cell applications", J. Vac. Sci. Technol., 16(4), Jul./Aug. 1979, pp. 994-1003.

Y. Ohya et al., "Preparation of transparent, electrically conducting ZnO film from zinc acetate and alkoxide", J. Mater. Sci., 1994(29), pp. 4099-4103.

Ishimori et al., "Epoxide Polymerization Catalyst—Diethyl Zinc-water system—Diethyl zinc-water system was used as a catalyst of polymerization of propylene oxide", Koka, vol. 70-6, 1967 pp. 964(106)-969(171).

International Search Report for corresponding International Application No. PCT/JP2010/057071, Aug. 3, 2010.

International Preliminary Report on Patentability with Written Opinion of the International Searching Authority for corresponding International Application No. PCT/JP2010/057071, Nov. 3, 2011.

Extended European Search Report for corresponding EP Application No. 10767087.9-1218, Oct. 18, 2012.

Japanese Official Notice for corresponding JP Application No. 2009-197052, Dec. 25, 2012.

Japanese Official Notice for corresponding JP Application No. 2009-102544, Dec. 25, 2012.

Japanese Office Action for corresponding JP Application No. 2009-115111, Dec. 10, 2013.

Kwon et al., "Variation in the Properties of ZnO:Al Films Grown by Using Atomic Layer Deposition with the Precursor-Pulse Ratio", Journal of the Korean Physical Society, Nov. 2003, pp. 709-713, vol. 43, No. 5.

Taiwanese Office Action for corresponding TW Application No. 099112530, Feb. 10, 2014.

Office Action for corresponding Japanese Application No. 2009-197052, with English language abstract, Apr. 30, 2014, 4 pages.

Chinese Office Action for related application No. 201080027443.X, issued Apr. 17, 2014, 26 pages.

Chinese Office Action and English Translation of Chinese Patent Application No. 201080027443.X, issued Dec. 3, 2014; 25 pages.

European Office Action corresponding to European Application No. 10767087.9-1355, dated Jan. 30, 2015; 5 pages.

Japanese Office Action for corresponding JP Application No. 2009-102544, Sep. 3, 2013.

Chinese Office Action for corresponding CN Application No. 201080027443.X, Aug. 2, 2013.

European Office Action for corresponding EP Application No. 10 767 087.9-1355, Sep. 25, 2013.

\* cited by examiner

COMPOSITION FOR MANUFACTURING DOPED OR UNDOPED ZINC OXIDE THIN FILM AND METHOD FOR MANUFACTURING ZINC OXIDE THIN FILM USING SAME

TECHNICAL FIELD

The first aspect of the present invention relates to a composition for manufacturing a zinc oxide thin film that is noncombustible, easy to handle, and prepared using an organic zinc compound as a starting material, and to a method for manufacturing a zinc oxide thin film using the same. More particularly, the present invention relates to a composition for manufacturing a zinc oxide thin film that is capable of forming a transparent zinc oxide thin film having a high degree of visible light transmittance by heating at a temperature of 300° C. or lower at a pressure in the vicinity of atmospheric pressure, and to a method for manufacturing a zinc oxide thin film employing this composition.

The second aspect of the present invention relates to a composition for manufacturing a zinc oxide thin film that is doped with a group IIIB element, noncombustible, easy to handle, and prepared using an organic zinc compound as a starting material, and to a method for manufacturing a zinc oxide thin film doped with a group IIIB element using the same. More particularly, the present invention relates to a composition for manufacturing a zinc oxide thin film doped with a group IIIB element that is capable of forming a transparent zinc oxide thin film having a high degree of visible light transmittance by heating at a temperature of 300° C. or lower at a pressure in the vicinity of atmospheric pressure, and to a method for manufacturing a zinc oxide thin film doped with a group IIIB element employing this composition.

The third aspect of the present invention relates to a composition for manufacturing a zinc oxide thin film permitting the preparation of a zinc oxide thin film having an average visible light transmittance of 80% or higher and having a volume resistivity that is low enough for use in thin antistatic films, thin UV-cutting films, and thin transparent electrodes. The composition for manufacturing a zinc oxide thin film of the present invention is prepared using an organic zinc oxide compound as a starting material, is noncombustible, is easy to handle, when employed as a spin coating or dip coating starting material, provides a zinc oxide thin film with the characteristic of a volume resistivity of less than $8 \times 10^{-2}$ $\Omega \cdot cm$, and when employed as a spray thermal decomposition coating starting material, provides a zinc oxide thin film with the characteristic of a volume resistivity of less than $1 \times 10^{-3}$ $\Omega \cdot cm$.

BACKGROUND ART

Transparent zinc oxide thin films that are doped or undoped with group IIIB elements and have high visible light transmittance are employed in a broad range of applications such as photocatalytic films, UV-cutting films, IR-reflecting films, the buffer layers of CIGS solar cells, the electrode films of dye-sensitized solar cells, antistatic films, compound semiconductor light-emitting elements, and thin-film transistors.

A variety of methods of manufacturing doped or undoped transparent zinc oxide thin films are known (Nonpatent Reference 1). The chemical vapor deposition (CVD) method (Nonpatent Reference 2), spray thermal decomposition method (Nonpatent Reference 3), spin coating method (Patent Reference 1), dip coat method (Nonpatent Reference 4), and the like are typical known coating methods employing starting materials in the form of organic zinc compounds.

However, the chemical vapor deposition (CVD) method presents various problems such as high manufacturing costs due to the necessity of using a large vacuum vessel and due to an extremely slow film formation rate, and does not permit the formation of large items because the size of the zinc oxide thin film that can be formed is limited by the size of the vacuum vessel.

The above coating methods afford more convenient apparatuses and achieve higher film formation rates than the chemical vapor deposition (CVD) method, thereby affording higher productivity and lower manufacturing costs. Moreover, since they are not limited by the vacuum vessel because there is no need to employ one, they afford an advantage in that large zinc oxide thin films can be produced.

In the spray thermal decomposition method, the solvent is dried simultaneously with the spray coating, after which the substrate temperature is raised to 360° C. or higher to obtain a thin zinc oxide coating.

In the above spin coating and dip coating methods, the solvent is dried following spin coating or dip coating, after which a thin zinc oxide coating is obtained by raising the substrate temperature to 400° C. or higher.

PRIOR ART DOCUMENTS

Patent Document

[Patent Reference 1] JP-A-H07-182939/1995

Nonpatent Reference

[Nonpatent Reference 1] The Japan Society for the Promotion of Science, Transparent Oxide Photoelectron Materials, Compiled by the 166th Committee, Transparent Conductive Film Technologies, 2nd Rev. Ed. (2006), pp. 165-173.
[Nonpatent Reference 2] K. Sorab, et al. Appl. Phys. Lett., 37(5), 1 Sep. 1980
[Nonpatent Reference 3] J. Aranovich, et al. J. Vac. Sci. Technol., 16(4), July/August 1979
[Nonpatent Reference 4] Y. Ohya, et al. J. Mater. Sci., 4099 (29), 1994

SUMMARY OF THE INVENTION

Problems to be Solved by the Invention

Plastic substrates have come to be employed as substrates in doped and undoped transparent zinc oxide thin films. Thus, it is necessary to conduct the heating that is applied during the formation of the transparent zinc oxide thin film at a temperature that is at or below the heat resistance temperature of the plastic substrate. However, in the spray thermal decomposition method described in Nonpatent Reference 3, the spin coating method described in Patent Reference 1, and the dip coating method described in Nonpatent Reference 4, heating conducted to or below the heat resistance temperature of the plastic substrate does not yield a transparent zinc oxide thin film. When the cost and the like of heating to the heat resistance temperature of the plastic substrate is taken into account, the heating that is required during film formation is desirably 300° C. or lower.

Based on researches by the present inventors, transparent zinc oxide thin films could not be obtained even when fabricated at 300° C. or lower with the aqueous solution of zinc acetate employed in the spray thermal decomposition method described in Nonpatent Reference 3, the solution comprised of an organic zinc compound and an organic solvent that is employed in the spin coating method described in Patent Reference 1, or the solution comprised of an organic zinc compound and an organic solvent that is employed in the dip coating method described in Nonpatent Reference 4; only nontransparent zinc oxide thin films were obtained. Patent Reference 1 describes a method of employing a hexane solution of diethylzinc. An attempt was made to fabricate a film at 300° C. or lower using this solution, but a transparent zinc oxide thin film could not be obtained.

Diethylzinc is combustible in the atmosphere. It is a compound requiring extreme care during storage and use. Use of diethylzinc in the spray thermal decomposition method, spin coating method, and the like is difficult in practice without its dilution or the like since these methods are normally conducted in an atmosphere in which water is present. The dangers of diethylzinc, such as combustibility, are reduced when it is dissolved in an organic solvent. However, in the formation of a zinc oxide thin film employing diethylzinc that has been dissolved while being reacted with an organic solvent such as an alcohol, such as is described in Patent Reference 1, heating to a temperature of 400° C. or higher is required.

One object of the present invention is to provide a composition, for manufacturing a thin silicon oxide film, that is prepared using an organic zinc compound as a starting material, noncombustible, easy to handle, and capable of forming a transparent zinc oxide thin film that is doped with a group IIIB element or undoped by heating to 300° C. or lower when heating is required. A further object of the present invention is to provide a method making it possible to use this composition to obtain a transparent zinc oxide thin film that is doped with a group IIIB element or undoped, which does not require heating during film formation, or which is heated to 300° C. or less taking into account the heat resistance temperature of a plastic substrate, the cost incurred by heating, and the like.

Means of Solving the Problems

The present invention relates to a composition for manufacturing a zinc oxide thin film, comprising a product obtained by adding water to a solution S1 that is obtained by dissolving the organic zinc compound denoted by general formula (1) below in an electron-donating organic solvent or to a solution S2 that obtained by dissolving the organic zinc compound denoted by general formula (1) below and at least one group IIIB element compound denoted by general formula (2) or (3) below in an electron-donating organic solvent to at least partially hydrolyze at least the organic zinc compound;

(wherein $R^1$ denotes a linear or branched alkyl group having 1 to 7 carbon atoms);

$$M_c X_d \cdot aH_2O \qquad (2)$$

(wherein M denotes a group IIIB element, X denotes a halogen atom, nitric acid, or sulfuric acid, when X denotes a halogen atom or nitric acid, c denotes 1 and d denotes 3, and when X denotes sulfuric acid, c denotes 2, d denotes 3, and a denotes an integer of from 0 to 9); and

(wherein M denotes a group IIIB element; each of $R^2$, $R^3$, and $R^4$ independently denotes hydrogen, a linear or branched alkyl group with 1 to 7 carbon atoms, a linear or branched alkoxyl group with 1 to 7 carbon atoms, a carboxylic acid group, or an acetyl acetonate group; L denotes a coordinated organic compound containing nitrogen, oxygen, or phosphorus; and n is an integer of from 0 to 9.)

The present invention can be roughly divided into three aspects.

The first aspect is a composition for manufacturing an undoped, zinc oxide thin film and a method for manufacturing a zinc oxide thin film employing this composition. In the first aspect, Solution S1 above is employed, and a composition comprising a product obtained by at least partially hydrolyzing the above organic zinc compound by adding water to solution S1 such that the molar ratio relative to the organic zinc compound falls within a range of 0.6 to 0.9. The composition of the first aspect is described in 1-1 to 1-7 below, and the manufacturing method of the first aspect is described in 1-8 to 1-9 below,

[1-1]

A composition for manufacturing a zinc oxide thin film, comprising a product manufactured by adding water to a solution that is obtained by dissolving the organic zinc compound denoted by general formula (1) below in an electron-donating organic solvent such that the molar ratio relative to the organic zinc compound falls within a range of 0.6 to 0.9, thereby at least partially hydrolyzing the organic zinc compound:

(wherein $R^1$ denotes a linear or branched alkyl group with 1 to 7 carbon atoms).

[1-2]

The composition described in [1-1], comprising a solution obtained by dissolving the above product separated from the above organic solvent in an organic solvent for forming a thin film different from the electron-donating organic solvent.

[1-3]

The composition described in [1-2], wherein the concentration of the product falls within a range of 3 to 12 mass %,

[1-4]

The composition described in any one of [1-1] to [1-3], wherein the organic zinc compound is a compound in which $R^1$ denotes an alkyl group with 1, 2, 3, 4, 5, or 6 carbon atoms.

[1-5]

The composition described in any one of [1-1] to [1-4], wherein the organic zinc compound is diethylzinc.

[1-6]

The composition described in any one of [1-1] to [1-5], wherein the electron-donating organic solvent is tetrahydrofuran.

[1-7]

The composition described in any one of [1-2] to [1-6], wherein the organic solvent for forming the thin film is 1,4-dioxane.

[1-8]

A method for manufacturing a zinc oxide thin film, comprising coating the composition described in any one of [1-1]

to [1-7] on the surface of a substrate, and heating the coating obtained at a temperature of 300° C. or lower to form a zinc oxide thin film.

[1-9]

The manufacturing method described in [1-8], wherein the zinc oxide thin film has an average visible light transmittance of 80% or higher.

The second aspect is a composition for manufacturing a zinc oxide thin film doped with a group IIIB element, and a method for manufacturing a zinc oxide thin film using this composition. In the second aspect, Solution S2 above is employed and a composition comprising a product obtained by at least partially hydrolyzing the above organic zinc compound such that the addition ratio of the group IIIB element compound to Solution S2 falls within a molar ratio range of 0.005 to 0.3 based on the organic zinc compound. The composition of the second aspect is described in 2-1 to 2-12 below. The manufacturing method of the second aspect is as described in 2-13 and 2-14 below.

[2-1]

A composition for manufacturing a doped zinc oxide thin film, comprising a product obtained by adding water to a solution that is obtained by dissolving the organic zinc compound denoted by general formula (1) below, and at least one group IIIB element compound denoted by general formula (2) or (3) below, in an electron-donating organic solvent and at least partially hydrolyzing at least the organic zinc compound, with the molar ratio of the group IIIB element compound to the organic zinc compound being 0.005 to 0.3:

$$R^1-Zn-R^1 \quad (1)$$

(wherein $R^1$ denotes a linear or branched alkyl group with 1 to 7 carbon atoms);

$$M_cX_d \cdot aH_2O \quad (2)$$

(wherein M denotes a group IIIB element; X denotes a halogen atom, nitric acid, or sulfuric acid, when X denotes a halogen atom or nitric acid, c denotes 1 and d denotes 3, and when X denotes sulfuric acid, c denotes 2, d denotes 3, and a denotes an integer of from 0 to 9); and

(wherein M denotes a group IIIB element; each of $R^2$, $R^3$, and $R^4$ independently denotes hydrogen, a linear or branched alkyl group with 1 to 7 carbon atoms, a linear or branched alkoxyl group with 1 to 7 carbon atoms, a carboxylic acid group, or an acetyl acetonate group; L denotes a coordinated organic compound containing nitrogen, oxygen, or phosphorus; and n is an integer of from 0 to 9).

[2-2]

The composition described in [2-1], wherein the product contains a hydrolysis product of the group IIIB element compound.

[2-3]

The composition of [2-1] or [2-2], wherein water is added in a quantity such that the molar ratio to the combined quantity of the organic zinc compound and the group IIIB element compound falls within a range of 0.4 to 0.9.

[2-4]

A composition for manufacturing a doped zinc oxide thin film comprising a product obtained by adding water to a solution that is obtained by dissolving the organic zinc compound denoted by general formula (1) in an electron-donating organic solvent to at least partially hydrolyze the organic zinc compound, and then adding at least one group IIIB element compound denoted by general formula (2) or (3) in a proportion yielding a molar ratio to the organic zinc compound of 0.005 to 0.3:

$$R^1-Zn-R^1 \quad (1)$$

(wherein $R^1$ denotes a linear or branched alkyl group with 1 to 7 carbon atoms);

$$M_cX_d \cdot aH_2O \quad (2)$$

(wherein M denotes a group IIIB element; X denotes a halogen atom, nitric acid, or sulfuric acid, when X denotes a halogen atom or nitric acid, c denotes 1 and d denotes 3, and when X denotes sulfuric acid, c denotes 2, d denotes 3, and a denotes an integer of from 0 to 9); and

(wherein M denotes a group IIIB element; each of $R^2$, $R^3$, and $R^4$ independently denotes hydrogen, a linear or branched alkyl group with 1 to 7 carbon atoms, a linear or branched alkoxyl group with 1 to 7 carbon atoms, a carboxylic acid group, or an acetyl acetonate group; L denotes a coordinated organic compound containing nitrogen, oxygen, or phosphorus; and n is an integer of from 0 to 9).

[2-5]

The composition described in [2-4], wherein the product contains substantially no hydrolysis product of the group IIIB element compound.

[2-6]

The composition described in [2-4] or [2-5], wherein water is added in a quantity such that the molar ratio to the organic zinc compound falls within a range of 0.4 to 0.9.

[2-7]

The composition described in any one of [2-1] to [2-6], wherein the content of the organic zinc compound denoted by general formula (1) is 0.5 wt % or less.

[2-8]

The composition described in any one of [2-1] to [2-7], comprising a solution obtained by dissolving the product in an organic solvent for forming a thin film that is different from the electron-donating organic solvent.

[2-9]

The composition described in any one of [2-1] to [2-8], wherein the concentration of the product falls within a range of 1 to 30 mass %.

[2-10]

The composition described in any one of [2-1] to [2-9], wherein the organic zinc compound is a compound in which $R^1$ denotes an alkyl group with 1, 2, 3, 4, 5, or 6 carbon atoms.

[2-11]

The composition described in any one of [2-1] to [2-10], wherein the organic zinc compound is diethylzinc.

[2-12]

The composition described in any one of [2-1] to [2-11], wherein the electron-donating organic solvent is 1,4-dioxane.

[2-13]

A method for manufacturing a doped zinc oxide thin film, comprising coating the composition described in any one of [2-1] to [2-12] on the surface of a substrate, and heating the coating obtained at a temperature of 300° C. or lower to form a group IIIB element-doped zinc oxide thin film.

[2-14]

The manufacturing method described in [2-13], wherein the doped zinc oxide thin film has an average visible light transmittance of 80% or higher.

The third aspect of the present invention is a composition for manufacturing a zinc oxide thin film that is doped with a group IIIB element. The third aspect is a composition comprising a product obtained by at least partially hydrolyzing an organic zinc compound using an electron-donating organic solvent with a boiling point of 110° C. or higher, or a mixed organic solvent containing a principal component in the aspect of an electron-donating organic solvent with a boiling point of 110° C. or higher, as an electron-donating organic solvent. The composition of the third aspect is as described in 3-1 to 3-10 below.

[3-1]

A composition comprising a product obtained by adding water to a solution that is obtained by dissolving the organic zinc compound denoted by general formula (1) in an electron-donating organic solvent having a boiling point of 110° C. or higher or in a mixed organic solvent containing an electron-donating organic solution having a boiling point of 110° C. or higher as a principal component to a concentration falling within a range of 4 to 12 mass % to a molar ratio falling within a range of 0.4 to 0.8 relative to the organic zinc compound to at least partially hydrolyze the organic zinc compound:

(wherein $R^1$ denotes a linear or branched alkyl group with 1 to 7 carbon atoms).

[3-2]

A composition obtained by adding to the composition described in [3-1] the organic group IIIB element compound denoted by general formula (2) below in a proportion yielding a molar ratio relative to the organic zinc compound of 0.005 to 0.1:

(wherein M denotes a group IIIB element; each of $R^2$, $R^3$, and $R^4$ independently denotes hydrogen, a linear or branched alkyl group with 1 to 7 carbon atoms, a linear or branched alkoxyl group with 1 to 7 carbon atoms, carboxylic acid, or an acetyl acetonate group; L denotes a coordinated organic compound containing nitrogen, oxygen, or phosphorus; and n is an integer of from 0 to 9).

[3-3]

A composition comprising a product obtained by adding water to a solution that is obtained by dissolving the organic zinc compound denoted by general formula (1) below:

(wherein $R^1$ denotes a linear or branched alkyl group with 1 to 7 carbon atoms) and the organic group IIIB element compound denoted by general formula (2) or (3) below in a proportion yielding a molar ratio of 0.005 to 0.09 relative to the organic zinc compound:

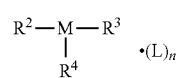

(wherein M denotes a group IIIB element; each of $R^2$, $R^3$, and $R^4$ independently denotes hydrogen, a linear or branched alkyl group with 1 to 7 carbon atoms, a linear or branched alkoxyl group with 1 to 7 carbon atoms, carboxylic acid, or an acetyl acetonate group; L denotes a coordinated organic compound containing nitrogen, oxygen, or phosphorus; and n is an integer of from 0 to 9)

(wherein M denotes a group IIIB element; X denotes a halogen atom, nitric acid, or sulfuric acid, when X denotes a halogen atom or nitric acid, c denotes 1 and d denotes 3, and when X denotes sulfuric acid, c denotes 2, d denotes 3, and a denotes an integer of from 0 to 9);
in an electron-donating organic solvent with a boiling point of 110° C. or higher, or a mixed organic solvent with a principal component in the form of an electron-donating organic solvent with a boiling point of 110° C. or higher, such that the combined concentration of the organic zinc compound and organic group IIIB element compound is 4 to 12 mass %, such that the molar ratio of water relative to the organic zinc compound falls within a range of 0.4 to 0.8 and partially hydrolyzing at least the organic zinc compound.

[3-4]

The composition described in any one of [3-1] to [3-3], wherein the boiling point of the electron-donating organic solvent is 230° C. or lower.

[3-5]

The composition described in any one of [3-1] to [3-4], wherein the organic zinc compound is diethylzinc.

[3-6]

The composition described in any one of [3-2] to [3-5], wherein the organic group IIIB element compound of general formula (2) is trimethyl indium.

[3-7]

The composition described in any one of [3-2] to [3-5], wherein the organic group IIIB element compound of general formula (2) is tris(acetylacetonato)aluminum, tris(acetylacetonato)gallium, or tris(acetylacetonato)indium.

[3-8]

The composition described in any one of [3-2] to [3-5], wherein the organic group IIIB element compound is aluminum chloride, gallium chloride or indium chloride.

[3-9]

The composition described in any one of [3-1] to [3-8], wherein the electron-donating organic solvent is 1,2-diethoxyethane.

[3-10]

The composition described in any one of [3-1] to [3-8], wherein the mixed organic solvent is a mixed solvent of 1,2-diethoxyethane and tetrahydrofuran.

Effect of the Invention

The composition for manufacturing a zinc oxide thin film of the first aspect of the present invention is noncombustible, easy to handle, and permits the manufacturing of a transparent zinc oxide thin film even at a film forming temperature of 300° C. or lower when employing the composition for manufacturing a zinc oxide thin film of the present invention.

The composition for forming a zinc oxide thin film doped with a group IIIB element of the second aspect of the present invention is noncombustible, easy to handle, and permits the manufacturing of a transparent zinc oxide thin film doped with a group IIIB element even at a film forming temperature of 300° C. or lower when employing the composition for manufacturing a zinc oxide thin film doped with a group IIIB element of the present invention.

When employing the composition for manufacturing a zinc oxide thin film of the third aspect of the present invention, it is possible to manufacture a zinc oxide thin film having the characteristics of an average visible light transmittance of 80% or greater and a volume resistivity of less than $8 \times 10^{-2}$ Ω·cm by spin coating or dip coating. Further, when employing the composition for manufacturing a zinc oxide thin film of the present invention, it is possible to manufacture a zinc oxide thin film having the characteristics of an average visible light transmittance of 80% or greater and a volume resistivity of less than $1 \times 10^{-3}$ Ω·cm by spray thermal decomposition.

The present inventors attempted to form films by the spin coating method using solutions comprised of the group IIIB element compounds and organic zinc compounds described in Patent Reference 1, to form films by the dip coating method employing a solution comprised of the organic zinc compounds and organic solvents described in Nonpatent Reference 2, and to form films by the spray thermal decomposition method employing the solutions of group IIIB element compounds and zinc acetate described in Nonpatent References 3 and 4. However, it was only possible to obtain zinc oxide thin films with a volume resistivity of $1 \times 10^{-1}$ Ω·cm or greater by the spin coating or dip coating method, and zinc oxide thin films with a volume resistivity of $1 \times 10^{-3}$ Ω·cm or greater by the spray thermal decomposition method. Zinc oxide thin films of lower resistivity were not obtained.

Further, when the heating temperature of the substrate during film formation was 400° C. or lower in the spray thermal decomposition method, it was only possible to obtain zinc oxide thin films with a volume resistivity of $1 \times 10^{-2}$ Ω·cm or greater. Zinc oxide thin films of lower resistivity were not obtained.

The present inventors also attempted to form films by the spin coating method using solutions of compositions in which diethylzinc had been partially hydrolyzed and solutions of compositions in which group IIIB element compounds and diethylzinc had been partially hydrolyzed. Zinc oxide thin films having an average visible light transmittance of 80% or greater were obtained (second aspect). The volume resistivity of the zinc oxide thin films obtained in the embodiments of the second aspect was $1 \times 10^{-1}$ Ω·cm or greater. To obtain zinc oxide thin films of lower resistivity, the partial hydrolysis of organic zinc compounds such as diethylzinc was conducted in an organic solvent having a boiling point higher than the organic solvent of the second aspect to prepare a composition comprising partial hydrolysis products. This composition was then coated to obtain a zinc oxide thin film having an average visible light transmittance of 80% or greater and a low volume resistivity of a degree suitable for use in thin antistatic films and the like.

MODES OF CARRYING OUT THE INVENTION

Figure 1:
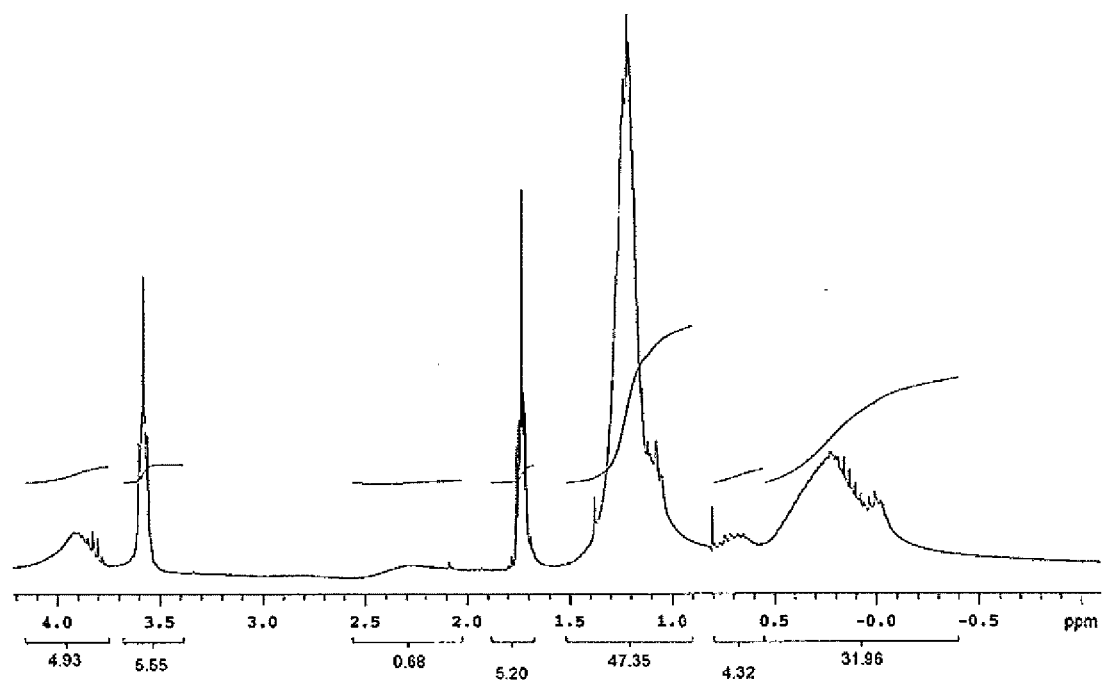
[FIG. 1] NMR spectrum of organic zinc composition obtained in Embodiment 1-1.

[The Composition for Manufacturing a Zinc Oxide Thin Film (First Aspect)]

The composition for manufacturing a zinc oxide thin film of the present invention is a composition for manufacturing a zinc oxide thin film comprising a product (sometimes referred to hereinafter as a "partial hydrolysis product") that is manufactured by adding water to a solution S1—obtained by dissolving the organic zinc compound denoted by general formula (1) below in an electron-donating organic solvent—so as to achieve a molar ratio relative to the organic zinc compound falling within a range of 0.6 to 0.9, and at least partially hydrolyzing the organic zinc compound:

$$R^1—Zn—R^1 \quad (1)$$

(wherein $R^1$ denotes a linear or branched alkyl group with 1 to 7 carbon atoms).

Use of the organic zinc compound denoted by general formula (1) as a polymerization catalyst for propylene oxide is described, for example, in Ishimori Michihiro, Takeda Nobuyuki, Tsuruta Teiji, Koka, 964 (166), 1967, and Japanese Unexamined Patent Publication (KOKAI) Showa Nos. 38-26099 and 38-6646. When employed as a polymerization catalyst for propylene oxide, water is added to the organic zinc composition to a molar ratio of 1.0 or greater relative to the organic zinc compound to obtain a partial hydrolysis product.

However, the above-cited literature neither describes nor suggests the possibility of forming a transparent zinc oxide thin film by taking a reaction product comprising a partial hydrolysis product obtained by adding water to a molar ratio falling within a range of 0.6 to 0.9 relative to the organic zinc compound and heating it to a temperature of 300° C. or lower. Research conducted by the present inventors has revealed that so long as the molar ratio of the water that is added relative to the organic zinc compound falls within the range of 0.6 to 0.9, the reaction product comprising the partial hydrolysis product that is obtained will form a transparent zinc oxide thin film even when heated to a temperature of 300° C. or lower. Keeping the molar ratio to 0.6 or higher makes it possible to obtain an organic zinc composition at a high yield of 90% or greater based on the zinc contained in the starting material while suppressing the amount of unreacted starting material in the form of residual organic zinc compound of general formula (1). Keeping the molar ratio to 0.9 or lower suppress the production of gel during the reaction.

The electron-donating organic solvent need only to have capability of dissolution with regard to the organic zinc compound denoted by general formula (1) and water. Examples are: diethyl ether, di-n-propyl ether, diisopropyl ether, dibutyl ether, tetrahydrofuran, dioxane, glyme, diglyme, triglyme, other ether solvents, trimethylamine, triethylamine, triphenylamine, and other amine solvents. Tetrahydrofuran is desirable as the electron-donating solvent.

Specific examples of the alkyl group denoted by $R^1$ in the compound denoted by general formula (1) are: a methyl group, ethyl group, propyl group, isopropyl group, butyl group, isobutyl group, sec-butyl group, tert-butyl group, pentyl group, isopentyl group, neopentyl group, tert-pentyl group, hexyl group, isohexyl group, sec-hexyl group, tert-hexyl group, 2-hexyl group, and heptyl group. In the compound denoted by general formula (1), $R^1$ desirably denotes a compound having 1, 2, 3, 4, 5, or 6 carbon atoms. The compound denoted by general formula (1) is preferably diethylzinc.

The composition of the present invention contains a partial hydrolysis product manufactured by adding water in the above-stated molar ratio to the solution of a compound denoted by general formula (1) and an electron-donating organic solvent and at least partially hydrolyzing the compound. The concentration of the compound denoted by general formula (1) in the solution of the compound denoted by general formula (1) and an electron-donating organic solvent can be suitably determined taking into account its solubility in the solvent and the like. For example, a concentration falling within a range of 2 to 50 mass % is suitable.

The water can be added without mixing with another solvent, or after having been mixed with another solvent. The addition of water also depends on the scale of the reaction. For example, the addition can be conducted over a period of from 60 seconds to 10 hours. From the perspective of achieving a good product yield, it is desirable to add the water dropwise to the starting material organic zinc compound of general formula (1). The water can be added without stirring the solution of the compound denoted by general formula (1) and an electron-donating organic solvent (in a static state), or while stirring. The addition can be made at a temperature selected anywhere between −90 and 150° C. A temperature of from −15 to 5° C. is desirable from the perspective of the reactivity of water and the organic zinc compound.

Following addition of the water, the water and the compound denoted by general formula (1) can be left standing without stirring (in a static state) or can be stirred for a period of from 1 minute to 48 hours to allow the reaction to progress. The reaction can be conducted at any temperature between −90 and 150° C. A temperature of 5 to 80° C. is desirable from the perspective of achieving a high yield of the partial hydrolysis product. The reaction pressure is not limited. As needed, the reaction mixture can be sampled, the sample can be analyzed by NMR, IR, or the like, or the gases generated can be sampled to monitor the progress of the reaction of water and the compound denoted by general formula (1).

The organic solvent, the starting material organic zinc compound of general formula (1), and the water can be introduced by any of the usual methods, or can be introduced as mixtures with a solvent. These reaction steps can be conducted as batch operations, semi-batch operations, or continuous operations, and are not specifically limited. However, batch operations are desirable.

In the above reaction, the organic zinc compound denoted by general formula (1) is at least partially hydrolyzed with the water, yielding a product comprising a partial hydrolysis product. Products obtained by reaction with water when the organic zinc compound of general formula (1) is diethylzinc have been analyzed from long time before, but different results have been reported and the composition of the products has not been clearly specified. The composition of the product may also vary with the molar ratio of the water added, the reaction period, and the like. In the present invention, the principal component of the product is presumed to be one or a mixture of several of the compounds denoted by general formula (2) with different values of m:

$$R^1\text{—}Zn\text{—}[O\text{—}Zn]_m\text{—}R^1 \qquad (2)$$

(wherein $R^1$ is identical to $R^1$ in general formula (1) and m denotes an integer of from 2 to 20).

After completion of the reaction, a common method such as filtration, concentration, extraction, or column chromatography can be used to recover and purify part or all of the product. When the starting material organic zinc compound of general formula (1) remains in the reaction product, it can be recovered by the above methods. Recovery is desirable.

The composition that is recovered by separation from the electron-donating organic solvent by the above method can be dissolved in a thin film-forming organic solvent that is different from the electron-donating organic solvent employed in the reaction and employed as a coating solution. It is also possible to employ the reaction product mixture as a coating solution as is, or by suitably adjusting the concentration thereof, without separating the electron-donating organic solvent.

The "thin film-forming organic solvent that is different from the electron-donating organic solvent employed in the reaction" is desirably a solvent with a boiling point of 85° C. or higher, for example. That is because a relatively high boiling point means low volatility and prevents deterioration in handling properties due to evaporation of the solvent and drying of the coating during the coating operation.

Examples of thin film-forming organic solvents are: aliphatic hydrocarbon solvents such as pentane, hexane, heptane, octane, and petroleum ether; aromatic hydrocarbon solvents such as benzene, toluene, ethylbenzene, and xylene; ether solvents such as diethyl ether, diisopropyl ether, glyme, diglyme, triglyme, dioxane, and tetrahydrofuran; and amine solvents such as trimethylamine, triethylamine, and triphenylamine. These can be employed singly or in mixtures of two or more. Taking into account the solubility of the reaction product containing the partial hydrolysis product of the organic zinc compound contained in the reaction product, the volatility of the organic solvent itself, and the like, 1,4-dioxane, methylmonoglyme, ethylmonoglyme, and methyldiglyme are desirable as thin film-forming organic solvents.

The solid component concentration of the composition for forming a zinc oxide thin film can be selected as desired between 1 and 30 mass %. The higher the concentration, the fewer coating times are required to form a thin film. However, a concentration of 3 to 12 mass % is desirable when the solubility of the reaction product containing the partial hydrolysis product of the organic zinc compound and the ease of forming a transparent zinc oxide thin film are taken into account.

[The Method for Manufacturing a Zinc Oxide Thin Film (First Aspect)]

The present invention relates to a method for manufacturing a zinc oxide thin film. This method comprises coating the above-described composition for forming a zinc oxide thin film on the surface of a substrate and heating the coating obtained at a temperature of 300° C. or lower to form a zinc oxide thin film.

The coating can be applied to the substrate surface by any of the usual methods, such as dip coating, spin coating, spray thermal decomposition, the ink-jet method, and screen printing. Spray thermal decomposition is a method of applying a coating while heating the substrate. Thus, it is possible to dry the solvent while applying the coating. Depending on the conditions, there are cases in which heating to dry the solvent is unnecessary following application of the coating. Further, depending on conditions, there are cases in which, in addition to drying, at least a portion of the partial hydrolysis product of the organic zinc compound reacts to form zinc oxide. Thus, there are cases where a zinc oxide thin film can be more readily formed by heating to a prescribed temperature in a subsequent step. In the spray thermal decomposition method, the substrate can be heated to a temperature falling within a range of 50 to 250° C., for example.

The composition can be coated on the surface of the substrate in an inert gas atmosphere such as nitrogen, in air, in air of relatively high humidity containing a large amount of water vapor, in an oxidizing gas atmosphere such as oxygen, in a reducing gas atmosphere such as hydrogen, or in a mixed gas atmosphere of any of the above, at atmospheric pressure or under increased pressure. The product contained in the composition of the present invention reacts with moisture in the atmosphere and gradually decomposes. Thus, coating is desirably conducted in an inert gas atmosphere not containing moisture. The coating in the method of the present invention can also be applied under reduced pressure. However, it is desirably applied under atmospheric pressure in terms of the simplicity of the apparatus.

After coating the coating liquid on the substrate surface, the substrate can be heated to a prescribed temperature as needed to dry off the solvent. Subsequently, it can be heated to a prescribed temperature to form a zinc oxide thin film.

The solvent drying temperature can fall within a range of 20 to 200° C., for example. A suitable period can be set based on the type of organic solvents coexisting. The temperature of the heating used to form zinc oxide following drying of the solvent, for example, falls within a range of 20 to 300° C., desirably within a range of 50 to 250° C., and preferably, within a range of 100 to 200° C. The same temperature can be used to dry the solvent and subsequently form the zinc oxide, thereby making it possible to simultaneously dry the solvent and form zinc oxide.

As needed, the formation of zinc oxide can be promoted or crystallinity can be enhanced by conducting the heating in an oxidizing gas atmosphere such as oxygen, in a reducing gas atmosphere such as hydrogen, or in a plasma atmosphere of hydrogen, argon, or oxygen. The thickness of the zinc oxide thin film is not specifically limited, but in practical terms, desirably falls within a range of from 0.05 to 2 μm. The manufacturing method of the present invention permits the suitable manufacturing of a thin film with a thickness falling within this range by repeating the above coating (drying) and heating one or more times.

The zinc oxide thin film formed by the manufacturing method of the present invention desirably has an average visible light transmittance of 80% or greater, preferably an average visible light transmittance of 85% or greater. The "average visible light transmittance" is defined and measured as follows. The average visible light transmittance refers to the average transmittance of light ranging from 380 to 780 nm and is measured with a spectrophotometer for the ultraviolet and visible regions. The average visible light transmittance can be expressed as the visible light transmittance at 550 nm. The visible light transmittance varies (increases) with the amount of zinc oxide produced by heating during spray coating or following coating. Thus, it is desirable to set the conditions of heating (temperature and duration) during spray coating or following coating, so as to achieve a thin film with a visible light transmittance of 80% or higher.

The substrate that is employed in the first aspect of the present invention is, for example, a transparent base material film. The transparent base material film can be a plastic film. Desirable polymers for forming plastic films are polyesters (such as polyethylene terephthalate (PET), polyethylene naphthalate (PEN), and poly(meth)acrylics (such as polymethyl methacrylate (PMMA)); polycarbonates (PC); polystyrenes; polyvinyl alcohols; polyvinyl chlorides; polyvinylidene chlorides; polyethylenes; cyclic polyolefins (COP); ethylene-vinyl acetate copolymers; polyurethanes; triacetate; and cellophane. Of these, PET, PEN, PC, and PMMA are desirable. The transparent base material film can be an oriented or non-oriented film depending on the polymer. For example, polyester films such as PET films are normally biaxially oriented films, while PC films, triacetate films, cellophane films, and the like are normally non-oriented films.

[The Composition for Manufacturing a Zinc Oxide Thin Film Doped with a Group IIIB Element (Second Aspect)]

The composition for manufacturing a zinc oxide thin film doped with a group IIIB element contains either (i) a product (sometimes referred to as partial hydrolysis product 1 hereinafter) obtained by adding water to a solution S2—obtained by dissolving the organic zinc compound denoted by general formula (1) below, and at least one group IIIB element compound denoted by general formula (2) or (3) below, in an electron-donating organic solvent—and at least partially hydrolyzing at least the organic zinc compound, or (ii) a product (sometimes referred to as partial hydrolysis product 2 hereinafter) obtained by adding water to a solution—obtained by dissolving the organic zinc compound denoted by general formula (1) in an electron-donating organic solvent—and at least partially hydrolyzing the organic zinc compound, and then adding at least one group IIIB element compound denoted by general formula (2) or (3) below:

(wherein $R^1$ denotes a linear or branched alkyl group with 1 to 7 carbon atoms);

(wherein M denotes a group IIIB element; X denotes a halogen atom, nitric acid, or sulfuric acid, when X denotes a halogen atom or nitric acid, c denotes 1 and d denotes 3, and when X denotes sulfuric acid, c denotes 2, d denotes 3, and a denotes an integer of from 0 to 9); and

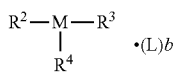

(3)

(wherein M denotes a group IIIB element; each of $R^2$, $R^3$, and $R^4$ independently denotes hydrogen, a linear or branched alkyl group with 1 to 7 carbon atoms, a linear or branched alkoxyl group with 1 to 7 carbon atoms, a carboxylic acid group, or an acetyl acetonate group; L denotes a coordinated organic compound containing nitrogen, oxygen, or phosphorus; and b is an integer of from 0 to 9).

In the partial hydrolysis product, water is added to a mixed solution of an organic zinc compound and a group IIIB element compound. Thus, the product normally contains the hydrolysis product of the group IIIB element compound. The hydrolysis product of the group IIIB element compound depends on the quantity of water that is added and the like, but can be a partial hydrolysis product. Further, in partial hydrolysis product 2, the group IIIB element compound is added after adding water to the organic zinc compound. Although the hydrolysis product depends on the quantity of water added and the like, when the group IIIB element compound is added after the water that has been added has been consumed in hydrolysis of the organic zinc compound, the product will normally not contain a hydrolysis product of the group IIIB element compound. The group IIIB element compound is incorporated as is as a starting material without hydrolysis, or the organic group present in the partial hydrolysis product of the organic zinc compound switches with the organic group (ligand) of the group IIIB element compound (ligand replacement).

The quantity of water added is such that the molar ratio to the combined quantity of the organic zinc compound and the group IIIB element compound falls within a range of 0.4 to 0.9 in partial hydrolysis product 1. The quantity of water added is such that the molar ratio to the organic zinc compound falls within a range of 0.4 to 0.9 in partial hydrolysis product 2.

It is desirable to limit the molar ratio of the water added relative to the combined quantity of the organic zinc compound and the organic group IIIB element compound or the organic zinc compound to within a range of 0.4 to 0.9. Limiting the molar ratio to 0.4 or higher makes it possible to obtain an organic zinc composition containing a product obtained by the partial hydrolysis of the organic zinc compound at a high yield of 90% or higher based on the zinc contained in the starting material. Further, in partial hydrolysis product 1, a suitable quantity of the group IIIB element compound is partially hydrolyzed. By keeping the molar ratio to 0.4 or higher, the quantities of unreacted starting material organic zinc compound and group IIIB element compound that remain can be suppressed in the case of partial hydrolysis product 1, and the quantity of organic zinc compound that remains can be suppressed in the case of partial hydrolysis product 2. As a result, it is possible to obtain an organic zinc composition that can be safely handled. Keeping the molar ratio to 0.9 or lower suppress the production of gel in the hydrolysis reaction. When gelling occurs in the hydrolysis reaction, the solution viscosity rises, sometimes rendering subsequent operations difficult. The molar ratio of the water added desirably falls within a range of 0.6 to 0.8, preferably within a range of 0.6 to 0.75.

The electron-donating organic solvent need only to have capability of dissolution with respect to the organic zinc compound denoted by general formula (1), the group IIIB element compounds denoted by general formulas (2) and (3), and water. Examples are: diethyl ether, di-n-propyl ether, diisopropyl ether, dibutyl ether, tetrahydrofuran, dioxane, glyme, diglyme, triglyme, other ether solvents, trimethylamine, triethylamine, triphenylamine, and other amines solvents. Tetrahydrofuran and dioxane are desirable as the electron-donating solvent.

The organic zinc compound denoted by general formula (1) is identical to that described in the first aspect of the present invention.

Specific examples of the metal denoted by M in the group IIIB element compound denoted by general formula (2) are: B, Al, Ga, and In. Specific examples of anion components for forming a salt denoted by X are fluorine, chlorine, bromine, iodine, nitric acid, sulfuric acid, and phosphoric acid. Specific examples of the group IIIB element compounds denoted by general formula (2) are: boron chloride, aluminum chloride hexahydrate, aluminum nitrate nonahydrate, gallium chloride, gallium nitrate hydrate, indium chloride tetrahydrate, and indium nitrate pentahydrate.

Specific examples of the metal denoted by M in the group IIIB element compound denoted by general formula (3) are B, Al, Ga, and In. $R^2$, $R^3$, and $R^4$ are desirably hydrogen. Alternately, $R^2$, $R^3$, and $R^4$ are desirably alkyl groups. Specific examples of these alkyl groups are: methyl groups, ethyl groups, propyl groups, isopropyl groups, butyl groups, isobutyl groups, sec-butyl groups, tert-butyl groups, pentyl groups, isopentyl groups, neopentyl groups, tert-pentyl groups, hexyl groups, isohexyl groups, sec-hexyl groups, tert-hexyl groups, 2-hexyl groups, and heptyl groups. It is desirable for at least one from among $R^2$, $R^3$, and $R^4$ to denote hydrogen, and for the remainder to denote alkyl groups. Examples of the ligand denoted by L are: trimethylamine, triethylamine, triphenylamine, pyridine, morpholine, N,N-dimethylalanine, N,N-diethylalanine, triphenylphosphine, dimethyl sulfide, diethyl ether, and tetrahydrofuran. Specific examples of the group IIIB element compound denoted by general formula (3) are: diborane, borane-tetrahydrofuran complex, borane-trimethylamine complex, borane-triethylamine complex, triethylborane, tributylborane, alane-trimethylamine complex, alane-triethylamine complex, trimethylaluminum, dimethylaluminum hydride, triisobutylaluminum, diisobutylaluminum hydride, trimethylgallium, triethylgallium, trimethylindium, and triethylindium. From the perspectives of low cost and ready availability, triethylaluminum, triisobutylaluminum, trimethylgallium, and trimethylindium are preferred.

In the composition of the present invention, the organic zinc compound denoted by general formula (1) and the group IIIB element compound denoted by general formula (2) or (3) are added in a proportion such that the molar ratio of the latter to the former is from 0.005 to 0.3. When an excessive quantity of the group IIIB element compound is added, it tends to function as an impurity and compromise film characteristics. Thus, a proportion of 0.005 to 0.1 is desirable. However, in partial hydrolysis product 1, a partial hydrolysis product is obtained by adding water to a solution containing the organic zinc compound and group IIIB element compound in the above-stated molar ratio. In partial hydrolysis product 2, water is added to a solution containing the organic zinc compound to obtain a partial hydrolysis product, to which the group IIIB element compound is then added in the molar ratio set forth above.

In the solution obtained by dissolving the compound denoted by general formula (1) and the group IIIB element compound denoted by general formula (2) or (3) in an electron-donating organic solvent, the concentration of the combined quantity of the compound denoted by general formula (1) and the group IIIB element compound denoted by general formula (2) or (3) can be suitably determined taking into account solubility in the solvent and the like. By way of example, a concentration falling within a range of from 0.1 to 50 mass % is suitable.

When the group IIIB element compound of general formula (2) or (3) is added after at least partially hydrolyzing the organic zinc compound denoted by general formula (1), the concentration of the compound denoted by general formula (1) in the solution obtained by dissolving the compound denoted by general formula (1) in an electron-donating organic solvent can be suitably determined taking into account solubility in the solvent and the like. By way of example, a concentration falling within a range of from 0.1 to 50 mass % is suitable.

The water can be added with or without having been mixed with another solvent. Although depending on the scale of the reaction, the water can be added over a period of from 60 seconds to 10 hours. From the perspective of achieving a good product yield, the water is desirably added dropwise to the starting material organic zinc compound of general formula (1). The water can be added without stirring (static state) the solution of the compound denoted by general formula (1) in an electron-donating organic solvent, or while stirring the solution. The temperature during addition can be selected as desired between −90 and 150° C. A temperature of from −15 to 30° C. is desirable from the perspective of the reactivity of the water and the organic zinc compound.

Following the addition of water, to enhance progression of the reaction between the water, the compound denoted by general formula (1), and the compound denoted by general formula (2) or (3), or the reaction between the water and the compound denoted by general formula (1), the mixture can be left standing (in a static state) without stirring, or stirred, for from 1 minute to 48 hours. Any reaction temperature between −90 and 150° C. can be selected. A reaction temperature of from 5 to 80° C. is desirable from the perspective of obtaining the partial hydrolysis product in high yield. The reaction pressure is not limited. The reaction is normally carried out at ordinary (atmospheric) pressure. As needed, the reaction mixture can be sampled, the sample can be analyzed by NMR, IR, or the like, or the gases generated can be sampled to monitor the progress of the reaction of water and the compound denoted by general formula (1).

The organic solvent, the starting material organic zinc compound of general formula (1), and the water can be introduced into the reactor by any of the usual methods, or can be introduced as mixtures with a solvent. These reaction steps can be conducted as batch operations, semi-batch operations, or continuous operations, and are not specifically limited. However, batch operations are desirable.

In the above reaction, the organic zinc compound denoted by general formula (1) and the group IIIB element compound denoted by general formula (2) or (3), or the organic zinc compound denoted by general formula (1) are at least partially hydrolyzed with the water, yielding a product containing a partial hydrolysis product. The products obtained by reaction with water when the organic zinc compound of general formula (1) is diethylzinc have been analyzed from long time before, but different results have been reported and the composition of the products has not been clearly specified. The composition of the product may also vary with the molar ratio of the water added, the reaction period, and the like. In the present invention, the principal component of the product is a compound combining the structural units denoted by general formulas (4) and (5) below with the structural unit denoted by general formula (6) below, or a mixture of multiple compounds of varying values of m in the case of partial hydrolysis product 1:

$$(R_1-Zn)- \quad\quad\quad (4);$$

$$-[O-Zn]_m- \quad\quad\quad (5)$$

(wherein $R^1$ is identical to $R^1$ in general formula (1) and m denotes an integer of from 2 to 20); and

$$\begin{array}{c}-[O-M]-\\|\\Q\end{array} \quad\quad\quad (6)$$

(wherein M is identical to M in general formula (2) or (3), Q is identical to X, $R^2$, $R^3$, or $R^4$ in general formula (2) or (3), and m denotes an integer of from 2 to 20).

With respect to partial hydrolysis product 2, presumed is either the compound denoted by general formula (8) below or a mixture of multiple compounds of varyings p:

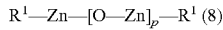

$$R^1-Zn-[O-Zn]_p-R^1 \quad (8)$$

(wherein $R^1$ is identical to $R^1$ in general formula (1) and p denotes an integer of from 2 to 20).

When the organic zinc compound is hydrolyzed without presence of group IIIB element compound, the composition is manufactured by adding the group 3B compound denoted by general formula (2) or (3) following the completion of the reaction. The group IIIB element compound is added in a quantity 0.005 to 0.3 relative to the quantity of organic zinc compound charged. From the perspective of ensuring the effect achieved by adding the group IIIB element compound, and since the film characteristics tend to deteriorate due to impurities when a large quantity is added, a quantity of 0.005 to 0.1 is preferred.

Following completion of the hydrolysis reaction, a common method such as filtration, concentration, extraction, or column chromatography can be used to recover and purify part or all of the product. When the group IIIB element compound is added following the completion of the hydrolysis reaction, part or all of the product can be recovered and purified by filtration.

When starting material organic zinc compound of general formula (1) remains in the reaction product, it can be recovered by the above methods. Recovery is desirable. Following recovery of the remaining starting material by these methods, the reaction product desirably does not contain the organic zinc compound denoted by general formula (1). For example, it desirably contains not more than 0.5 wt % of the organic zinc compound denoted by general formula (1). The composition of the present invention desirably does not contain residual organic zinc compound denoted by general formula (1) in unreacted form so that a uniform film can be formed when employed as a coating liquid.

The composition that is recovered by separation from the electron-donating organic solvent by the above method can be dissolved in a thin film-forming organic solvent that is different from the electron-donating organic solvent employed in the reaction, and employed as a coating solution. It is also possible to employ the reaction product mixture as a coating solution as is without separating the electron-donating organic solvent, or by suitably adjusting the concentration thereof.

The "thin film-forming organic solvent that is different from the electron-donating organic solvent employed in the reaction" is desirably a solvent with a boiling point of 85° C. or higher, for example. That is because a relatively high boiling point means low volatility and prevents deterioration in handling properties due to evaporation of the solvent and drying of the coating during the coating operation.

Examples of thin film-forming organic solvents are: aliphatic hydrocarbon solvents such as pentane, hexane, heptane, octane, and petroleum ether; aromatic hydrocarbon solvents such as benzene, toluene, ethylbenzene, and xylene; ether solvents such as diethyl ether, diisopropyl ether, glyme, diglyme, triglyme, dioxane, and tetrahydrofuran; and amine solvents such as trimethylamine, triethylamine, and triphenylamine. These can be employed singly or in mixtures of two or more. Taking into account the solubility of the reaction product containing the partial hydrolysis product of the organic zinc compound contained in the reaction product, the volatility of the organic solvent itself, and the like, 1,4-dioxane, methylmonoglyme, ethylmonoglyme, and methyldiglyme are desirable as thin film-forming organic solvents.

The solid component concentration of the composition for forming a zinc oxide thin film can be selected as desired between 1 and 30 mass %. The higher the concentration, the fewer coatings are required to form a thin film. However, a concentration of 1 to 12 mass % is desirable when the solubility of the reaction product containing the partial hydrolysis product of the organic zinc compound and the ease of forming a transparent zinc oxide thin film are taken into account.

[The Method for Manufacturing a Zinc Oxide Thin Film (Second Aspect)]

The present invention relates to a method for manufacturing a zinc oxide thin film. This manufacturing method comprises coating the composition for forming a zinc oxide thin film of the present invention on the surface of a substrate and then forming a zinc oxide thin film by heating the coating film obtained at a temperature of 300° C. or lower.

The coating can be applied to the substrate surface by any of the usual means, such as dip coating, spin coating, spray thermal decomposition, the ink-jet method, or screen printing. Spray thermal decomposition is a method of applying a coating while heating the substrate. Thus, it is possible to dry the solvent while applying the coating. Depending on the conditions, there are cases in which heating to dry the solvent is unnecessary following application of the coating. Further, depending on conditions, there are cases in which, in addition to drying, at least a portion of the partial hydrolysis product of the organic zinc compound reacts to form zinc oxide. Thus, there are cases where a zinc oxide thin film can be more readily formed by heating to a prescribed temperature in a subsequent step. In the spray thermal decomposition method, the substrate can be heated to a temperature falling within a range of 50 to 250° C., for example.

The composition can be coated on the surface of the substrate in an inert gas atmosphere such as nitrogen, in air, in air of relatively high humidity containing a large amount of water vapor, in an oxidizing gas atmosphere such as oxygen, in a reducing gas atmosphere such as hydrogen, or in a mixed gas atmosphere of any of the above, at atmospheric pressure or under increased pressure. The product contained in the composition of the present invention reacts with moisture in the atmosphere and gradually decomposes. Thus, coating is desirably conducted in an inert gas atmosphere not containing moisture. The coating in the method of the present invention can also be applied under reduced pressure. However, it is desirably applied under atmospheric pressure in terms of the simplicity of the apparatus.

After coating the coating liquid on the substrate surface, the substrate can be heated to a prescribed temperature as needed and the solvent dried off. Subsequently, it can be heated to a prescribed temperature to form a zinc oxide thin film.

The solvent drying temperature can fall within a range of 20 to 200° C., for example. A suitable period can be set based on the type of organic solvents coexisting. The temperature of the heating used to form zinc oxide following drying of the solvent for example falls within a range of 20 to 300° C., desirably within a range of 50 to 250° C., and preferably, within a range of 100 to 200° C. The same temperature can be used to dry the solvent and subsequently form the zinc oxide, thereby making it possible to simultaneously dry the solvent and form the zinc oxide.

As needed, the formation of zinc oxide can be promoted or crystallinity can be enhanced by conducting the heating in an oxidizing gas atmosphere such as oxygen, in a reducing gas atmosphere such as hydrogen, or in a plasma atmosphere of hydrogen, argon, or oxygen. The thickness of the zinc oxide thin film is not specifically limited, but in practical terms, desirably falls within a range of from 0.05 to 2 μm. The manufacturing method of the present invention permits the suitable manufacturing of a thin film with a thickness falling within this range by repeating the above coating (drying) and heating one or more times.

The zinc oxide thin film formed by the manufacturing method of the present invention desirably has an average visible light transmittance of 80% or greater, preferably an average visible light transmittance of 85% or greater. The "average visible light transmittance" is defined and measured as follows. The average visible light transmittance refers to the average transmittance of light ranging from 380 to 780 nm and is measured with a spectrophotometer for the ultraviolet and visible regions. The average visible light transmittance can be expressed as the visible light transmittance at 550 nm. The visible light transmittance varies (increases) with the degree of zinc oxide produced by heating during spray coating or following coating. Thus, it is desirable to set the conditions of heating (temperature and duration) during spray coating or following coating, so as to achieve a thin film with a visible light transmittance of 80% or higher.

Since the zinc oxide thin film that is formed by the manufacturing method of the present invention is doped with a group IIIB element, there is a substantial possibility of obtaining a film with low resistivity by devising further film forming methods.

The substrate that is employed in the second aspect of the present invention is identical to the substrate given by way of example for the first aspect of the present invention.

[The Composition for Forming a Zinc Oxide Thin Film (Third Aspect)]

The composition for manufacturing a zinc oxide thin film of the third aspect of the present invention includes the following three forms:

(i) a product (sometimes referred to as partial hydrolysis product 1 hereinafter) obtained by adding water to a solution S1—obtained by dissolving the organic zinc compound denoted by general formula (1) below in an electron-donating organic solvent—and at least partially hydrolyzing the organic zinc compound;

(ii) a product (sometimes referred to as partial hydrolysis product 2 hereinafter) obtained by adding water to a solution S1—obtained by dissolving the organic zinc compound denoted by general formula (1) below in an electron-donating organic solvent and at least partially hydrolyzing the organic zinc compound, and then adding at least one group IIIB element compound denoted by general formula (2) or (3); and (iii) a product (sometimes referred to as partial hydrolysis product 3 hereinafter) obtained by adding water to a solution S2—obtained by dissolving the organic zinc compound denoted by general formula (1) below, and at least one group IIIB element compound denoted by general formula (2) or (3) below, in an electron-donating organic solvent—and at least partially hydrolyzing at least the organic zinc compound:

$$R^1\!-\!Zn\!-\!R^1 \tag{1}$$

(wherein $R^1$ denotes a linear or branched alkyl group with 1 to 7 carbon atoms);

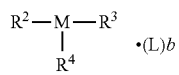
 $\cdot(L)b$ (2)

(wherein M denotes a group IIIB element; each of $R^2$, $R^3$, and $R^4$ independently denotes hydrogen, a linear or branched alkyl group with 1 to 7 carbon atoms, a linear or branched alkoxyl group with 1 to 7 carbon atoms, carboxylic acid group, or an acetyl acetonate group; L denotes a coordinated organic compound containing nitrogen, oxygen, or phosphorus; and b denotes an integer of from 0 to 9); and $$M_cX_d\cdot aH_2O \tag{3}$$

(wherein M denotes a group IIIB element; X denotes a halogen atom, nitric acid, or sulfuric acid, when X denotes a halogen atom or nitric acid, c denotes 1 and d denotes 3, and when X denotes sulfuric acid, c denotes 2, d denotes 3; and a denotes an integer of from 0 to 9).

In the present invention, an electron-donating organic solvent with a boiling point of 110° C. or higher or a mixed organic solvent containing a principal component in the form of an electron-donating organic solvent with a boiling point of 110° C. or higher is employed as the above electron-donating organic solvent. The use of such a solvent has been discovered by the present inventors to permit the formation of a zinc oxide thin film having the characteristics of an average transmittance of 80% or higher and a volume resistivity of less than $8\times10^{-2}$ Ω·cm.

In an embodiment of Patent Reference 2, tetrahydrofuran (boiling point: 66° C.) is employed as an organic solvent for partial hydrolysis. In an embodiment of Patent Reference 3, 1,4-dioxane (boiling point: 101.1° C.) is employed as an organic solvent for partial hydrolysis. Although transparent zinc oxide thin films were obtained in both cases, they were not zinc oxide thin films having a low volume resistivity of less than $8\times10^{-2}$ Ω·cm. Tetrahydrofuran and 1,4-dioxane were employed because they were thought to readily suppress the product of gel during hydrolysis and be advantageous to the generation of partial hydrolysis products. However, through trial and error, it has been found that even when an electron-donating organic solvent having a boiling point of 110° C. or higher is employed, it is possible to produce a partial hydrolysis product without generating gel during hydrolysis.

When the handling properties, particularly drying properties, during the subsequent coating step are taken into account, it is desirable for the electron-donating organic solvent to have a boiling point of 110° C. or higher. In addition to having a boiling point falling within this range, it is sufficient for the electron-donating organic solvent to have capability of dissolution with respect to the organic zinc compound denoted by general formula (1) and water. Examples are: ether solvents such as di-n-butyl ether (boiling point: 142.4° C.), dihexyl ether (boiling point: 226.2° C.), anisole (boiling point: 153.8° C.), phenetole (boiling point: 172° C.), butyl phenyl ether (boiling point: 210.3° C.), pentyl phenyl ether (boiling point: 214° C.), methoxytoluene (boiling point: 171.8° C.), benzyl ethyl ether (boiling point: 189° C.), diphenyl ether (boiling point: 258.3° C.), veratrole (boiling point: 206.7° C.), trioxane (boiling point: 114.5° C.), 1,2-diethoxyethane (boiling point: 121° C.), 1,2-dibutoxyethane (boiling point: 203.3° C.), other glymes, bis(2-methoxyethyl)ether (boiling point: 162° C.), bis(2-ethoxyethyl)ether (boiling point: 188.4° C.), bis(2-butoxyethyl)ether (boiling point: 254.6° C.), other diglymes, 1,2-bis(2-methoxyethoxy)ethane (boiling point: 216° C.), bis[2-(2-methoxyethoxyethyl)]ether (boiling point: 275° C.), and other triglymes; and amine solvents such as tri-n-propylamine (boiling point: 150-156° C.), tri-n-pentylamine (boiling point: 130° C.), N,N-dimethylaniline (boiling point: 193° C.), N,N-diethylaniline (boiling point: 217° C.), and pyridine (boiling point: 115.3° C.). A glyme in the form of 1,2-diethoxyethane (boiling point: 121° C.) is desirable as the electron-donating organic solvent from the perspectives of both surppressing gelling during composition preparation and the volatility of the solvent itself. The upper limit of the boiling point of the electron-donating organic solvent is not specifically limited. However, from the perspective of a relatively short drying time of the film to remove the solvent once the composition has been applied, an upper limit of 230° C. is desirable.

It suffices for a mixed organic solvent containing a primary component in the form of an electron-donating organic solvent with a boiling point of 110° C. or higher to have capability of dissolution with respect to the organic zinc compound denoted by general formula (1) and water. Examples are: octane (boiling point: 125.7° C.) and tetrahydrofuran (boiling point: 66° C.); octane and 1,4-dioxane; nonane (boiling point: 150.8° C.), and tetrahydrofuran; nonane and 1,4-dioxane; decane (boiling point: 174.1° C.) and tetrahydrofuran; decane and 1,4-dioxane, undecane and tetrahydrofuran, undecane and 1,4-dioxane, dodecane (boiling point: 216.3° C.) and tetrahydrofuran; dodecane and 1,4-dioxane; toluene (boiling point: 110.6° C.) and tetrahydrofuran; toluene and 1,4-dioxane; xylene (boiling point: 138-145° C.) and tetrahydrofuran; xylene and 1,4-dioxane; ethylbenzene (boiling point: 136.2° C.) and tetrahydrofuran; ethylbenzene and 1,4-dioxane, butylbenzene (boiling point: 169-183° C.) and tetrahydrofuran, butylbenzene and 1,4-dioxane, pentylbenzene (boiling point: 205.4° C.) and tetrahydrofuran, pentylbenzene and 1,4-dioxane, mesitylene (boiling point: 164.7° C.) and tetrahydrofuran, mesitylene and 1,4-dioxane, diethylbenzene (boiling point: 181-184° C.) and tetrahydrofuran; and diethylbenzene and 1,4-dioxane. Taking into account the volume resistivity of the zinc oxide thin film that is formed, the secondary component is desirably tetrahydrofuran. Taking into account handling properties during film formation, the weight ratio relative to the principal component of the secondary component tetrahydrofuran or 1,4-dioxane is desirably 0.05 to 0.45.

The concentration of the compound denoted by general formula (1) in the solution obtained by dissolving the compound denoted by general formula (1) in the above electron-donating organic solvent or in a mixed organic solvent containing the electron-donating organic solvent desirably falls within a range of 4 to 12 mass %. This is because, even when employing an electron-donating organic solvent with a boiling point of 110° C. or higher, it tends to be difficult to form a zinc oxide thin film of the desired transparency and conductivity when the concentration of the compound denoted by general formula (1) falls below 4 mass % or exceeds 12 mass %. The concentration of the compound denoted by general formula (1) in the solution in the above-described organic solvent desirably falls within a range of 6 to 10 mass %.

The quantity of water added is set to achieve a molar ratio to the organic zinc compound falling within a range of 0.4 to 0.8 for partial hydrolysis products 1 and 2, and set to achieve a molar ratio to the combined quantity of the organic zinc compound and group IIIB element compound falling within a range of 0.4 to 0.8 for partial hydrolysis product 3. By keeping the quantity of water added within this range, in the cases of spin coating and dip coating, the reaction product containing the partial hydrolysis product obtained will be capable of forming a zinc oxide thin film having characteristics in the form of a volume resistivity of less than $8\times10^{-2}$ $\Omega\cdot$cm, and in the case of spray thermal decomposition, forming a zinc oxide thin film having characteristics in the form of a volume resistivity of $1\times10^{-3}$ $\Omega\cdot$cm.

By keeping the molar ratio to not less than 0.4, it is possible to obtain an organic zinc composition containing a product obtained by partially hydrolyzing an organic zinc compound at a high yield of 90% or greater based on the zinc contained in the starting material. In partial hydrolysis product 3, a moderate quantity of a group IIIB element compound is also partially hydrolyzed. By keeping the molar ratio to not less than 0.4, in the case of partial hydrolysis products 1 and 2, the quantity of residual unreacted starting material organic zinc compound can be suppressed, and in the case of partial hydrolysis product 3, the quantities of residual organic zinc compound and group IIIB element compound can be suppressed. As a result, it becomes possible to obtain an organic zinc composition that can be safely handled. Keeping the molar ratio to not greater than 0.8 suppresses the generation of gel in the hydrolysis reaction. When gel is generated in the hydrolysis reaction, the viscosity of the solution increases and subsequent operations sometime become difficult. From the above perspective, the molar ratio of the water that is added desirably falls within a range of 0.6 to 0.8, and preferably falls within a range of 0.6 to 0.75.

In partial hydrolysis product 2, since a group IIIB element compound is added after adding water to the organic zinc compound, although depending on the quantity of water added and the like, the added water is consumed in hydrolysis of the organic zinc compound. When a group IIIB element compound is subsequently added, the product generally does not contain a hydrolysis product of the group IIIB element compound. The group IIIB element compound can be contained as a starting material without being hydrolyzed. The possibility also exists of the organic groups present in the partial hydrolysis product of the organic zinc compound undergoing an exchange (undergoing a ligand exchange) with the organic groups (ligands) of the group IIIB element compound. In partial hydrolysis compound 3, since water is added to a mixed solution of the organic zinc compound and a group IIIB element compound, the above product normally contains a hydrolysis product of the group IIIB element compound. The hydrolysis product of the group IIIB element compound depends on the quantity of water added and the like, but can be a partial hydrolysis product.

The addition of water can be conducted using water that has not been mixed with another solvent, or can be conducted using a mixed solvent obtained by mixing water with another solvent. From the perspective of suppressing the progression of local hydrolysis, it is desirable to employ a mixed solvent. The content of water in the mixed solvent can fall, for example, within a range of 1 to 50 mass %, desirably 2 to 20 mass %. Solvents that can be employed in mixed solvents with water include the above electron-donating organic solvents. The electron-donating organic solvent can be an organic solvent with a boiling point of 110° C. or higher, or an organic solvent with a boiling point lower than 110° C. However, from the perspective of the necessity of high activity relative to diethylzinc and solubility in water, an organic solvent with a boiling point lower than 110° C. is desirable.

Although also depending on the scale of the reaction, the addition of water can be conducted over a period of from 60 seconds to 10 hours. From the perspective of achieving a high product yield, it is desirable to add the water or mixture of solvent and water in dropwise fashion to the starting material organic zinc compound of general formula (1). The addition of water can be conducted without stirring (in a static state), or while stirring, the solution of the compound denoted by general formula (1) and an electron-donating organic solvent. The water can be added at a temperature anywhere between −90 and 150° C. A temperature between −15 and 30° C. is desirable from the perspective of the reactivity of water with the organic zinc compound.

Following the addition of water, to promote the reaction of water, the compound denoted by general formula (1) and the compound denoted by general formula (2) or (3), or the reaction of water and the compound denoted by general formula (1), for example, the mixture can be left without stirring (in a static state), or stirred, for from 1 minute to 48 hours. The reaction can be conducted at any temperature between −90 and 150° C. From the perspective of obtaining a partial hydrolysis product in high yield, the reaction temperature desirably falls within a range of 5 to 80° C. The reaction pressure is not limited. The reaction can normally be conducted at ordinary (atmospheric) pressure. Progress of the reaction of water and the compound denoted by general formula (1) can be monitored as needed by sampling the reaction mixture, analyzing the samples by NMR, IR, or the like, or sampling the gases that are produced.

The organic zinc compound denoted by general formula (1) is identical to that described in the first aspect of the present invention above.

The group IIIB element compound denoted by general formula (2) and the group IIIB element compound denoted by general formula (3) are respectively identical to the compounds set forth above in the second aspect of the present invention. However, the group IIIB element compound denoted by general formula (2) in the third aspect of the present invention is the group IIIB element compound denoted by general formula (3) in the second aspect of the present invention, and the group IIIB element compound denoted by general formula (3) in the third aspect of the present invention is the group IIIB element compound denoted by general formula (2) in the second aspect of the present invention.

In partial hydrolysis products 2 and 3 of the composition of the present invention, addition such that the molar ratio of the group IIIB element compound denoted by general formula (2) or (3) to the organic zinc compound denoted by general formula (1) is from 0.005 to 0.09 is suitable from the perspective of obtaining a zinc oxide thin film in which a suitable addition effect of the group 3B compound is achieved. However, in partial hydrolysis product 2, water is added to a solution containing an organic zinc compound to obtain a partial hydrolysis product, after which the group IIIB element compound is added in the above molar ratio. In partial hydrolysis product 3, water is added to the solution containing the organic zinc compound and the group IIIB element compound to obtain a partial hydrolysis product in the above molar ratio.

The above organic solvent, starting material organic zinc compound of general formula (1), and water or mixture of water and solvent can be introduced into the reactor by any of the usual methods. These reaction steps can be conducted as batch operations, semi-batch operations, or continuous operations, and are not specifically limited. However, batch operations are desirable.

In the above reaction, the organic zinc compound denoted by general formula (1) and the group IIIB element compound denoted by general formula (2) or (3), or the organic zinc compound denoted by general formula (1), is partially hydrolyzed by water, yielding a product containing a partial hydrolysis product. Analysis of products obtained in the reaction with water when the organic zinc compound denoted by general formula (1) is diethylzinc has been conducted from long time before, but the results vary with the report and the composition of the products has not been clearly specified. Product composition may also vary with the molar ratio of the water added, the reaction temperature, and the like.

Partial hydrolysis products 1 and 2 are the compounds denoted by general formula (4) below or are presumed to be mixtures of multiple compounds of varying p:

$$R^1\text{—}Zn\text{—}[O\text{—}Zn]_p\text{—}R^1 \qquad (4)$$

(wherein $R^1$ is identical to $R^1$ in general formula (1) and p denotes an integer of from 2 to 20).

In the present invention, in the case of partial hydrolysis product 3, the principal component is a compound combining the structural units denoted by general formulas (5) and (6) below and the structural unit denoted by general formula (7) below, or is presumed to be a mixture of multiple compounds of varying m:

$$(R_1\text{—}Zn)\text{—} \qquad (5)$$

$$\text{—}[O\text{—}Zn]_m\text{—} \qquad (6)$$

(wherein $R^1$ is identical to $R^1$ in general formula (1) and m denotes an integer of from 2 to 20)

$$\begin{array}{c}\text{—}[O\text{—}M]\text{—}\\ |\\ Q\end{array} \qquad (7)$$

(wherein M is identical to M in general formula (2) or (3); Q is identical to any one from among X, $R^2$, $R^3$, or $R^4$ in general formula (2) or (3); and m denotes an integer of from 2 to 20).

In the course of hydrolysis of the above organic zinc compound, in the case of partial hydrolysis product 2 in which no group IIIB element compound is present, the composition is produced by adding the group 3B compound denoted by general formula (2) or (3) following the completion of the reaction. The quantity of the group IIIB element compound that is added is suitably 0.005 to 0.09 relative to the quantity of organic zinc compound that is charged, as set forth above.

Following completion of the hydrolysis reaction, a common method such as filtration, concentration, extraction, or column chromatography can be used to recover and purify part or all of the product. When the group IIIB element compound is added following completion of the hydrolysis reaction, part or all of the product can be recovered and purified by filtration. When the starting material organic zinc compound of general formula (1) remains in the reaction product, it can be recovered by the above methods. Recovery is desirable. For each of partial hydrolysis products 1 to 3, the reaction product following the recovery of the remaining starting material by these methods desirably does not contain the organic zinc compound denoted by general formula (1). For example, the content of the organic zinc compound denoted by general formula (1) is desirably 0.5 wt % or less. The fact that the composition of the present invention does not contain residual unreacted organic zinc compound denoted by general formula (1) is desirable from the perspective of achieving a uniform film when employed as a coating liquid.

The solution prepared by the above method can be used as is as a coating solution for forming a zinc oxide thin film. Alternately, it can be suitably diluted or concentrated. From the perspective of simplifying the manufacturing steps, the solution that is prepared by the above method is desirably of a concentration that can be employed as is as a coating solution to form a zinc oxide thin film.

[The Method for Manufacturing a Zinc Oxide Thin Film]

The method for manufacturing a zinc oxide thin film employing the compound for forming a zinc oxide thin film of the present invention will be described. The composition for forming a zinc oxide thin film of the present invention is coated on the surface of a substrate and the coating obtained is heated to obtain a zinc oxide thin film. When the coating is conducted by spin coating or dip coating, for example, a zinc oxide thin film having an average transmittance of 80% or higher and the characteristics of a volume resistivity of less than $8\times10^{-2}$ Ω·cm can be obtained. When the coating is conducted by spray thermal decomposition, a zinc oxide thin film having an average visible light transmittance of 80% or higher and characteristics of a volume resistivity of less than $1\times10^{-3}$ Ω·cm can be formed.

The coating can be applied to the substrate surface by any of the usual methods, such as dip coating, spin coating, spray thermal decomposition, the ink-jet method, and screen printing.

The composition can be coated on the surface of the substrate in an inert gas atmosphere such as nitrogen, in air, in air of relatively high humidity containing a large amount of water vapor, in an oxidizing gas atmosphere such as oxygen, in a reducing gas atmosphere such as hydrogen, or in a mixed gas atmosphere of any of the above, at atmospheric pressure or under increased pressure.

Using the spin coating or dip coating method, a film can be formed in an inert gas atmosphere, or in an atmosphere having a relative humidity of 2 to 15% achieved by mixing an inert gas and water vapor.

The spray thermal decomposition method is a method that can be conducted while heating the substrate. Thus, the solvent can be dried while applying the coating. Depending on the conditions, there are cases in which no heating is required to dry the solvent. Further, depending on conditions, there are cases in which, in addition to drying, at least a portion of the partial hydrolysis product of the organic zinc compound reacts to form zinc oxide. Thus, there are cases where a zinc oxide thin film can be more readily formed by heating to a prescribed temperature in a subsequent step. The substrate can be heated to a temperature falling within a range of 50 to 550° C., for example.

Figure 17:
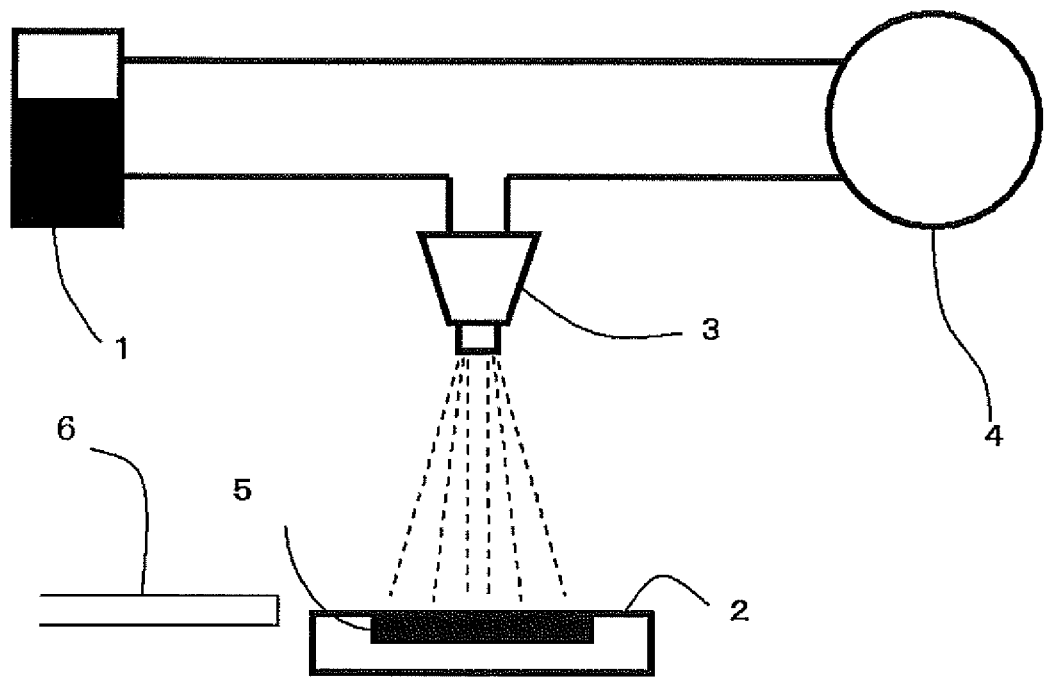
[FIG. 17] Drawing showing spray film-forming apparatus.

FIG. 17 shows a spray film-forming apparatus that can be used in the spray thermal decomposition method. In the figure, 1 denotes a spray bottle filled with coating liquid, 2 denotes a substrate holder, 3 denotes a spray nozzle, 4 denotes a compressor, 5 denotes a substrate, and 6 denotes a water vapor introduction tube. In spray coating, the substrate is placed on substrate holder 2 and a heater is used as needed to heat it to a prescribed temperature. Subsequently, in a prescribed atmosphere, compressed inert gas and the coating liquid are simultaneously fed through spray nozzle 3 positioned above the substrate, and the coating liquid is atomized and sprayed to form a zinc oxide thin film on the substrate. By using spray coating, the zinc oxide thin film is formed without additional heating or the like.

From the perspective of manufacturing a zinc oxide thin film having good film characteristics, when spray coating the coating liquid, it is desirable for the coating liquid to be sprayed through the nozzle such that the size of the liquid droplets ranges from 1 to 15 μm and the distance between the spray nozzle and the substrate is not greater than 50 cm.

Taking into account adhesion to the substrate and the tendency of the solvent to evaporate, the size of the liquid droplets sprayed through the spray nozzle is desirably such that all of the liquid droplets fall within a range of 1 to 30 μm. The size of the liquid droplets preferably falls within a range of 3 to 20 μm.

Taking into account the fact that some solvent evaporates while traveling from the spray nozzle to the substrate, reducing the size of the liquid droplets, and the like, the distance between the spray nozzle and the substrate is desirably not greater than 50 cm. From the perspective of satisfactorily forming a good zinc oxide thin film, the distance between the spray nozzle and the substrate desirably falls within a range of 2 to 40 cm.

In spray thermal decomposition, from the perspective of forming a zinc oxide thin film of lower volume resistivity, it is desirable to induce decomposition of the composition by introducing water vapor through water vapor introduction tube 6 in an inert gas atmosphere. For example, the quantity of water vapor introduced is desirably 0.1 to 5 as a molar ratio relative to the zinc in the composition that is introduced, preferably 0.3 to 2 from the perspective of obtaining a zinc oxide thin film of lower volume resistivity. When the quantity of water vapor introduced falls within a range of 0.3 to 2 as the above molar ratio, it becomes possible to form a zinc oxide thin film with better film characteristics, such as a volume resistivity of less than $1 \times 10^{-3}$ Ω·cm.

The water vapor can be introduced by any of the usual methods into the vessel used to manufacture the zinc oxide thin film. The water vapor and the composition desirably react in the vicinity of the heated substrate. For example, a water vapor-containing inert gas prepared by bubbling water in an inert gas can be introduced through a tube in the vicinity of a heated substrate.

After coating the coating liquid on the substrate surface, the substrate is heated as needed to a prescribed temperature and the solvent is dried. Subsequently, a zinc oxide thin film is formed by heating to a prescribed temperature.

The solvent may be dried at a temperature falling within a range of 20 to 200° C., for example. The temperature can be set as needed based on the type of organic solvent that is also present. The heating temperature for forming zinc oxide after drying the solvent, for example, falls within a range of 50 to 550° C., desirably within a range of 50 to 500° C. It is possible to employ the same temperature for both the solvent drying temperature and the subsequent zinc oxide forming temperature and simultaneously dry the solvent and form zinc oxide.

As needed, the above heating can be conducted in an oxidizing gas atmosphere such as oxygen, a reducing gas atmosphere such as hydrogen, or a plasma atmosphere of hydrogen, argon, or oxygen to promote the formation of zinc oxide or enhance crystallinity. The thickness of the zinc oxide thin film is not specifically limited, but in practical terms, a thickness falling within a range of 0.05 to 2 μm is desirable. Based on the above manufacturing method, except when employing spray thermal decomposition, the above coating (drying) heating can be repeated one or more times to suitably manufacture a thin film with a thickness within the stated range.

Although varying with the coating method, subsequent drying conditions, and heating conditions, the volume resistivity of the zinc oxide thin film formed by the above manufacturing method is desirable less than $8 \times 10^{-2}$ Ω·cm, preferably less than $1 \times 10^{-3}$ Ω·cm. The volume resistivity is the resistance per unit volume, and can be obtained by multiplying the surface resistance by the film thickness. The surface resistance can be measured by the four-probe method, for example, and the film thickness can be measured by SEM measurement, with a difference and film thickness measuring instrument by stylus method, or the like. Since the volume resistivity changes (increases) with the amount of zinc oxide produced by heating during or after spray coating, it is desirable to set the conditions of heating (temperature and duration) during and after spray coating to achieve a thin film volume resistivity of $8 \times 10^{-2}$ Ω·cm.

The zinc oxide thin film that is formed by the above manufacturing method desirably has an average visible light transmittance of 80% or higher, preferably an average visible light transmittance of 85% or higher. The term "average visible light transmittance" is defined and measured as follows. The average visible light transmittance refers to the average transmittance of light ranging from 380 to 780 nm and is measured with a spectrophotometer for the ultraviolet and visible regions. The average visible light transmittance can be expressed as the visible light transmittance at 550 nm. The visible light transmittance varies (increases) with the amount of zinc oxide produced by heating during spray coating or following coating. Thus, it is desirable to set the conditions of heating (temperature and duration) during spray coating or following coating, so as to achieve a thin film with a visible light transmittance of 80% or higher.

The substrate that is employed in the third aspect of the present invention is identical to that given by way of example for the first aspect of the present invention. Examples are: alkali glass, alkali-free glass, and transparent base material films. The transparent base material film can be a plastic film. However, there is no intention to limit to these exemplified materials.

[Applications of the Zinc Oxide Thin Film]

Since the zinc oxide thin film prepared by the above method has excellent transparence and electrical conductivity, it can be employed as an antistatic film, UV-cutting film, transparent electrically conductive film, or the like. Antistatic films can be employed in fields such as solid electrolytic capacitors, chemically amplified resists, and building materials such as window glass. UV-cutting films can be employed in fields such as the front filters of image display apparatuses, image pickup apparatuses such as drive recorders, illuminating apparatuses such as high-voltage discharge lamps, watch covers, and building materials such as window glass. Transparent electrically conductive films can be employed in fields such as FPDs, resistive film-type touch panels, electrostatic capacitance-type touch panels, thin film silicon solar cells, compound (CdTe, CIS) thin film solar cells, dye-sensitized solar cells, and organic thin film solar cells. However, there is no intention to limit to these fields.

There are broad applications for the zinc oxide thin film prepared by the above method. Zinc oxide thin films having the characteristics of a high visible light transmittance and a volume resistivity of less than $8 \times 10^{-2}$ Ω·cm can be employed as the electrodes of flat-panel displays (FPDs); the electrodes of resistive film-type touch panels and electrostatic capacitance-type touch panels; the upper electrodes of thin film silicon solar cells, compound (CdTe, CIS (copper indium diselenide)) thin film solar cells, dye-sensitized solar cells, and organic thin film solar cells; UV-cutting films; antistatic films; IR reflecting films; and the like.

[Embodiments]

The present invention will be described in greater detail below through embodiments. However, these embodiments do not limit the present invention. All preparation of the products containing partial hydrolysis products of organic zinc compounds and film formation using these products was conducted in nitrogen gas atmospheres. The solvents were all dehydrated and degassed for use.

[Embodiment 1-1]

To 165.0 g of tetrahydrofuran were added 41.66 g of diethylzinc. The mixture was thoroughly stirred and then cooled to −10° C. A tetrahydrofuran solution containing 5.0% water was added dropwise to achieve a molar ratio of water to diethylzinc of 0.6. Subsequently, the mixture was reacted for 18 hours at room temperature (22° C.) and the solvent and the unreacted diethylzinc were distilled off under vacuum, yielding 33.02 g of a product containing a partial hydrolysis product. The spectrum shown in FIG. 1 was obtained by NMR (THF-d8, ppm) measurement. The zinc content was 57.8% as measured by ICP. The zinc base yield was 91%.

The product containing a partial hydrolysis product obtained as set forth above was dissolved in a quantity yielding a concentration of 15% in 1,4-dioxane. Subsequently, a product-containing coating liquid containing the partial hydrolysis product was obtained by filtering out trace quantities of remaining insoluble material. Measurement of the coating liquid with an Ubbelohde viscometer revealed a viscosity of 1.07 mPa·s.

Figure 3:
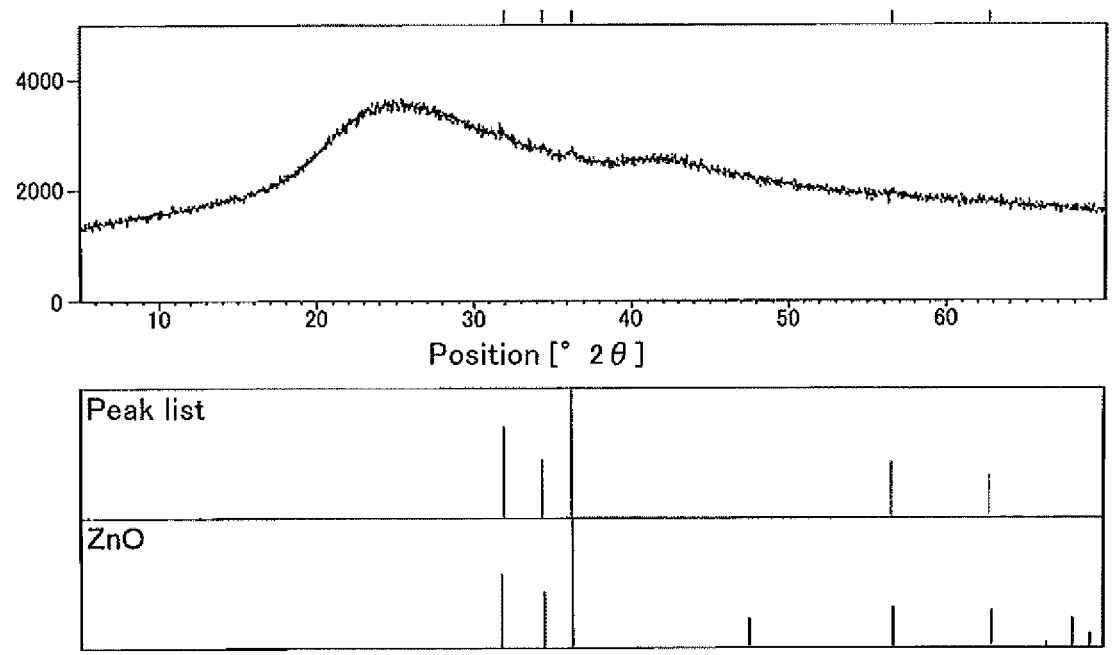
[FIG. 3] XRD spectrum of zinc oxide thin film obtained in Embodiment 1-3.
Figure 4:
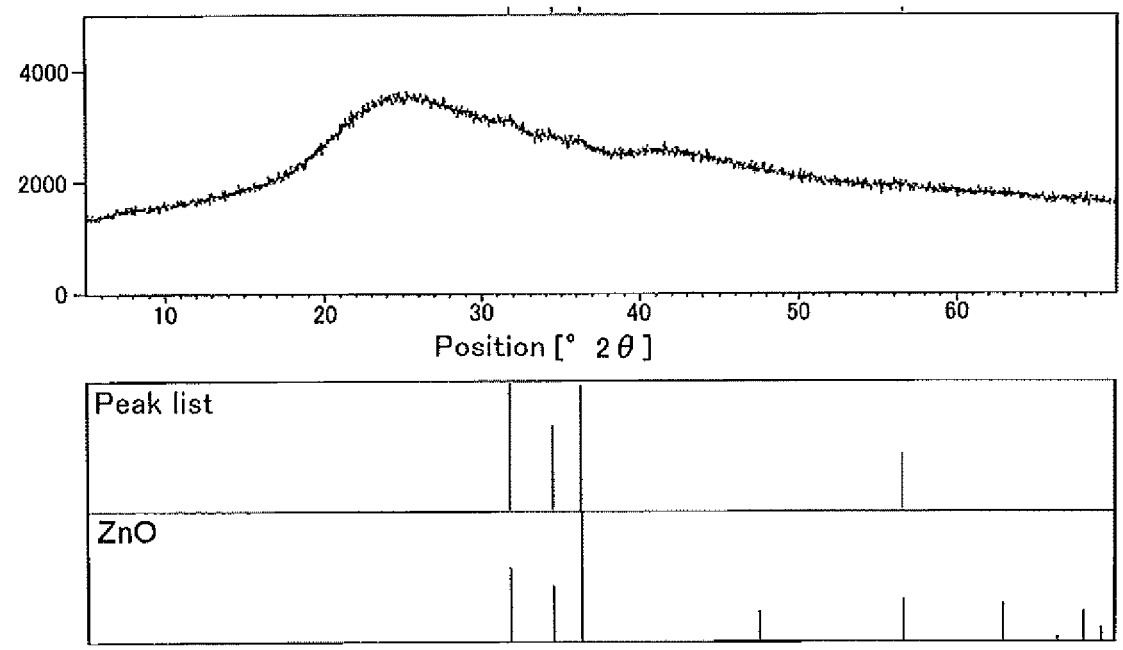
[FIG. 4] XRD spectrum of zinc oxide thin film obtained in Embodiment 1-4.

The product-containing coating liquid containing a partial hydrolysis product obtained as set forth above was spin coated on the surface of an 18 mm square Corning 1737 glass substrate. Subsequently, the substrate was heated to 120° C. for 4 minutes to dry the solvent and simultaneously form zinc oxide. These operations were repeated once. The thin film that was formed was 0.25 μm in thickness and, as shown in FIG. 3, was confirmed to be zinc oxide by XRD. The 550 nm visible light transmittance was 83%. A transparent zinc oxide thin film with a transmittance of 80% or higher was thus obtained.

[Embodiment 1-2]

With the exception that the solvent was dried by heating the substrate for 2 minutes at 120° C. after applying the coating, after which heating was conducted again for 2 minutes at 200° C., the same operation was conducted as in Embodiment 1-1. The thin film that was formed was 0.21 μm in thickness. The 550 nm visible light transmittance was 80%. A transparent zinc oxide thin film with a transmittance of 80% or higher was thus obtained.

[Embodiment 1-3]

Figure 2:
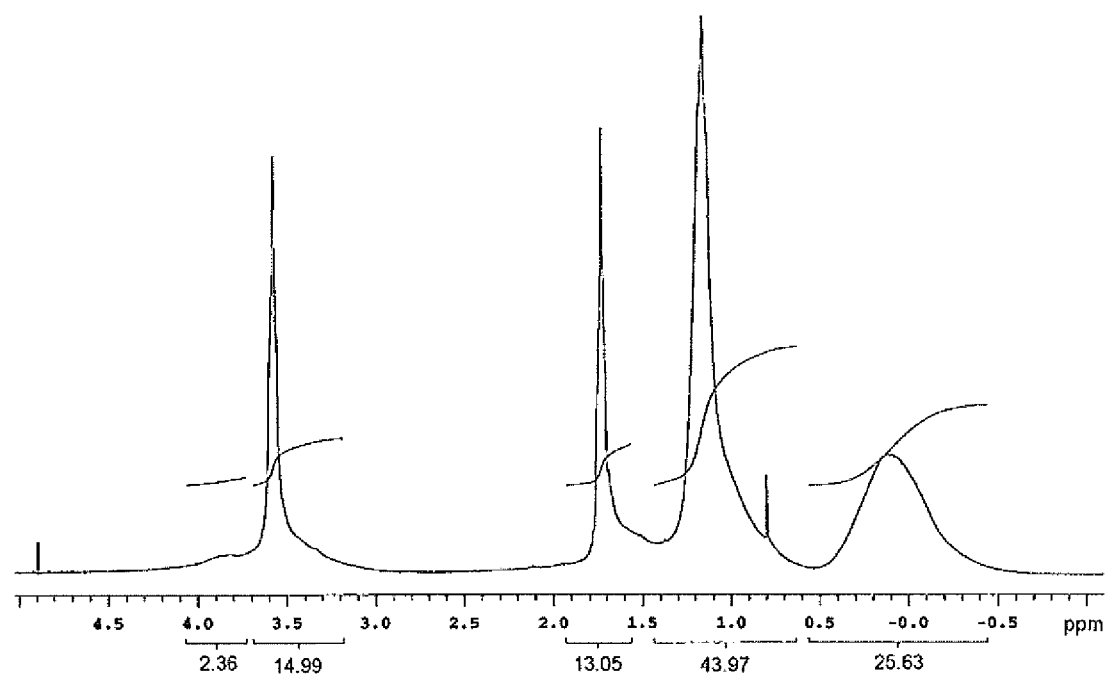
[FIG. 2] NMR spectrum of organic zinc composition obtained in Embodiment 1-2.

To 165.0 g of tetrahydrofuran were added 41.66 g of diethylzinc. The mixture was thoroughly stirred and then cooled to −10° C. A tetrahydrofuran solution containing 5.0% water was added dropwise to achieve a molar ratio of water to diethylzinc of 0.8. Subsequently, the mixture was reacted for 18 hours at room temperature and the solvent and the unreacted diethylzinc were distilled off under vacuum, yielding a product containing a partial hydrolysis product. The spectrum shown in FIG. 2 was obtained by NMR (THF-d8, ppm) measurement. The zinc content was 57.3% as measured by ICP. The zinc base yield was 90%.

The product containing a partial hydrolysis product obtained as set forth above was dissolved in a quantity yielding a concentration of 12% in 1,4-dioxane. Subsequently, a product-containing coating liquid containing the partial hydrolysis product was obtained by filtering out trace quantities of remaining insoluble material. Measurement of the coating liquid with an Ubbelohde viscometer revealed a viscosity of 1.17 mPa·s.

Figure 5:
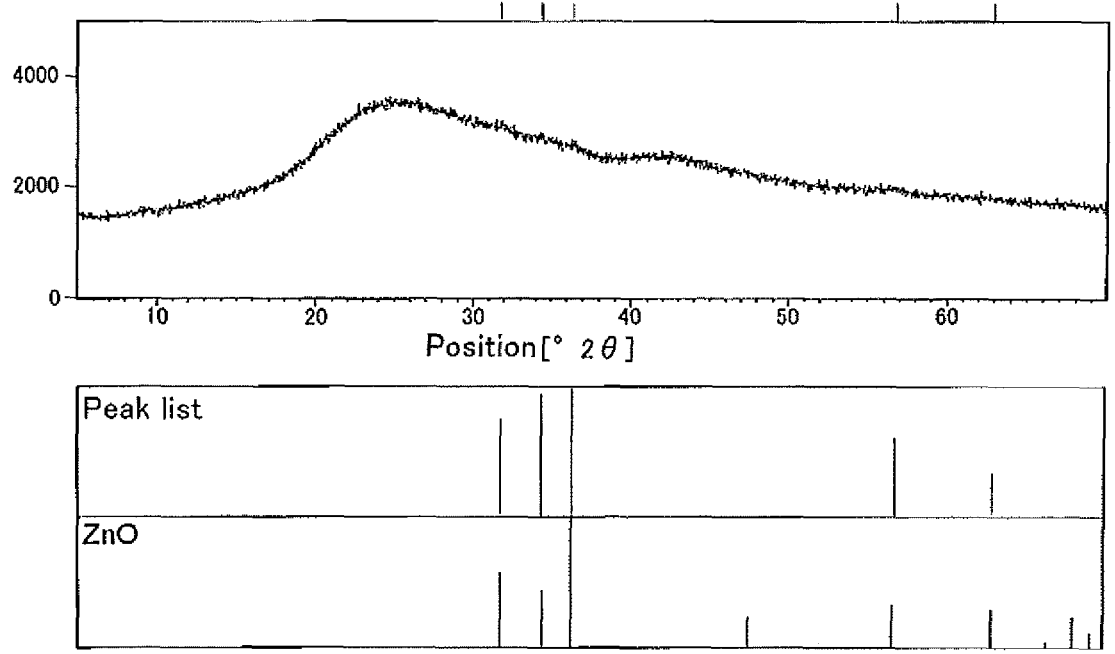
[FIG. 5] XRD spectrum of zinc oxide thin film obtained in Embodiment 1-5.

The product-containing coating liquid containing a partial hydrolysis product obtained as set forth above was spin coated on the surface of an 18 mm square Corning 1737 glass substrate. Subsequently, the substrate was heated to 120° C. for 4 minutes to dry the solvent and simultaneously form zinc oxide. These operations were repeated once. The thin film that was formed was 0.27 μm in thickness and, as shown in FIG. 5, was confirmed to be zinc oxide by XRD. The 550 nm visible light transmittance was 81%. A transparent zinc oxide thin film with a transmittance of 80% or higher was thus obtained.

[Embodiment 1-4]

Figure 6:
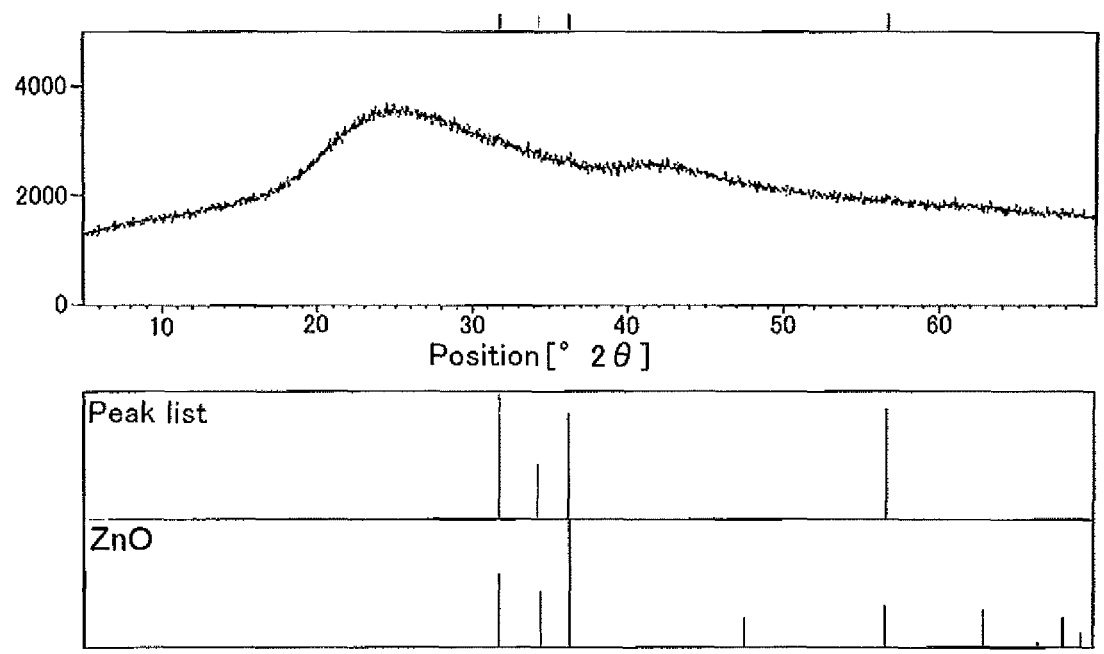
[FIG. 6] XRD spectrum of zinc oxide thin film obtained in Embodiment 1-6.
Figure 7:
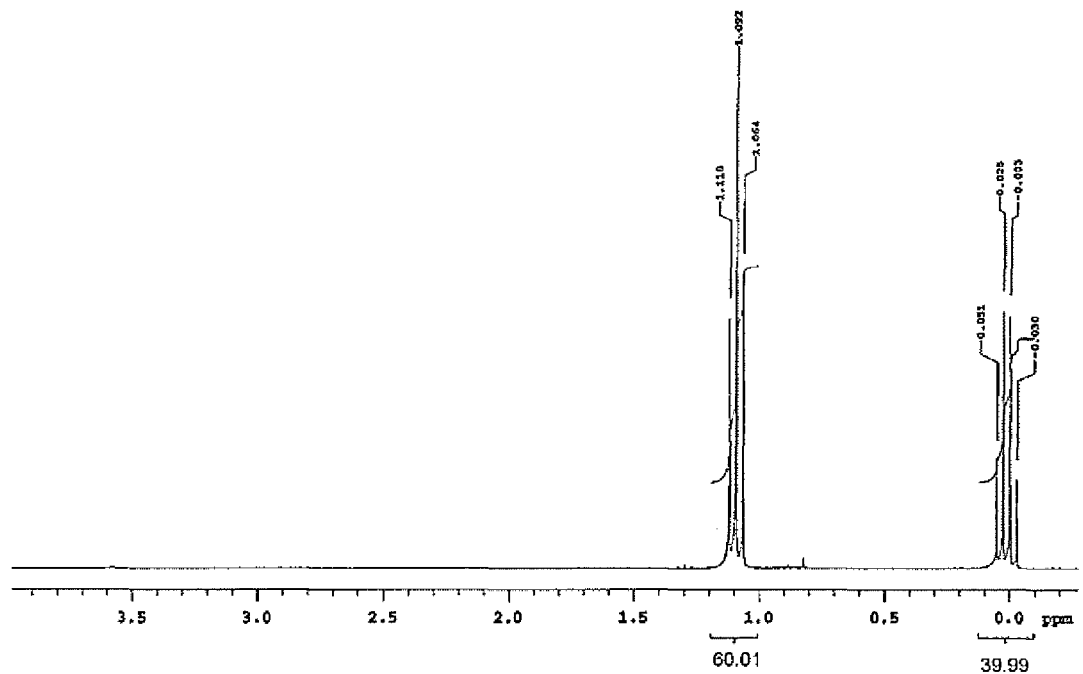
[FIG. 7] NMR spectrum of diethylzinc (reference figure).

With the exception that the solvent was dried by heating the substrate for 2 minutes at 120° C. after applying the coating, after which heating was conducted again for 2 minutes at 200° C., the same operation was conducted as in Embodiment 1-3. The thin film that was formed was 0.23 μm in thickness, and as shown in FIG. 6, was confirmed to be zinc oxide by XRD. The 550 nm visible light transmittance was 95%. A transparent zinc oxide thin film with a transmittance of 80% or higher was thus obtained.

[Reference Example 1-1]

To 165.0 g of tetrahydrofuran were added 41.66 g of diethylzinc. The mixture was thoroughly stirred and then cooled to −10° C. A tetrahydrofuran solution containing 5.0% water was added dropwise to achieve a molar ratio of water to diethylzinc of 1.05. When the mixture was subsequently reacted for 18 hours at room temperature, a large quantity of gel was produced. Since the gel that appeared was insoluble in all organic solvents, no coating liquid could be prepared.

[Comparative Example 1-1]

To 48.24 g of 2-methoxyethanol were added 8.50 g of zinc acetate dihydrate and an adjuvant in the form of 2.39 g of ethanolamine. The mixture was thoroughly stirred to obtain a coating liquid.

With the exception that the coating liquid was obtained as set forth above, a thin film was obtained by implementing the same operations as in Embodiment 1-1. The 550 nm visible light transmittance was 27%. Thus, only a non-transparent thin film with a transmittance of 80% or lower was obtained. The film was also nonuniform, and no peak derived from zinc oxide could be confirmed by XRD (not shown).

[Comparative Example 1-2]

With the exception that the solvent was dried by heating the substrate for 2 minutes at 120° C. after applying the coating, after which heating was conducted again for 2 minutes at 200° C., the same operation was conducted as in Comparative Example 1-1. The 550 nm visible light transmittance was 31%. Only an opaque thin film with a transmittance of 80% or lower was thus obtained. The film was also nonuniform, and no peak derived from zinc oxide could be confirmed by XRD (not shown).

[Embodiment 2-1]

Figure 8:
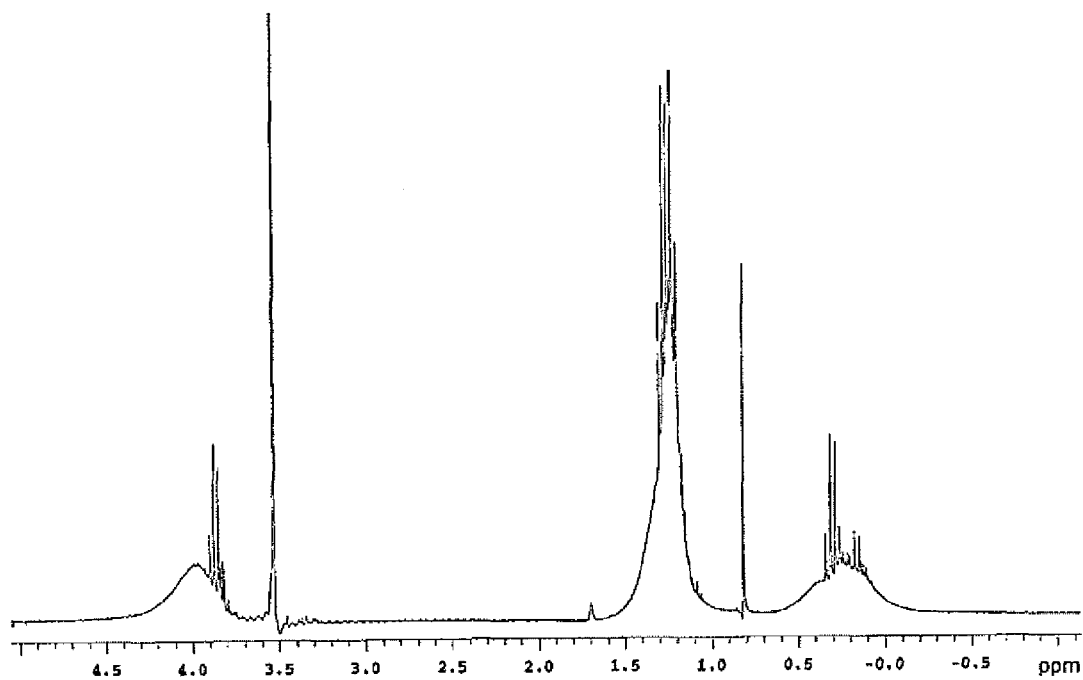
[FIG. 8] NMR spectrum of composition obtained in Embodiment 2-1 following vacuum drying.

To 30.0 g of 1,4-dioxane were added 1.91 g of diethylzinc. The mixture was thoroughly stirred and then cooled to 12° C. A 1,4-dioxane solution containing 5.0% water was added dropwise to achieve a molar ratio of water to diethylzinc of 0.6. Subsequently, the mixture was raised to room temperature (22° C.) and reacted at room temperature for 18 hours. Triethylaluminum was added to achieve a molar ratio of 0.02 to the diethylzinc that had been charged. The solution thus obtained was filtered with a membrane filter to obtain 32.1 g of a partial hydrolysis product solution containing aluminum (concentration 5.6 mass %). The solvent and the like were removed by vacuum distillation, after which the spectrum shown in FIG. 8 was obtained by NMR measurement (THF-d8, ppm).

Figure 9:
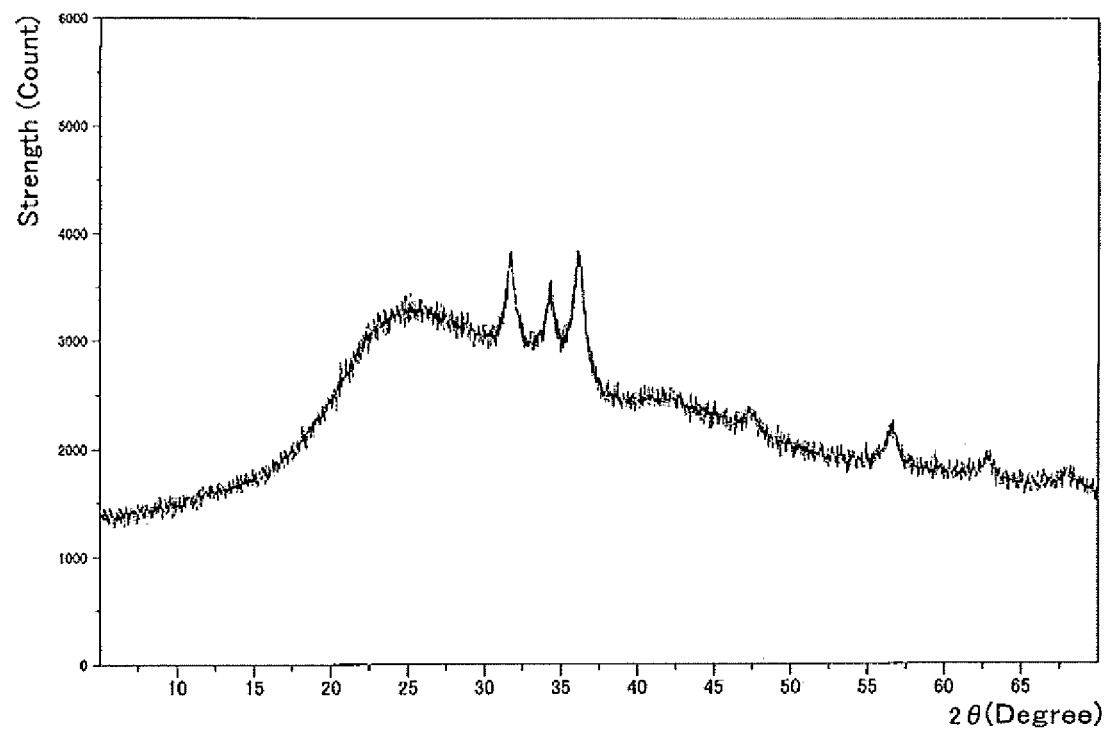
[FIG. 9] XRD spectrum of aluminum-doped zinc oxide thin film obtained in Embodiment 2-1.

The product-containing coating liquid containing a partial hydrolysis product obtained as set forth above was spin coated on the surface of an 18 mm square Corning 1737 glass substrate. Subsequently, the substrate was heated to 120° C. for 4 minutes to dry the solvent and simultaneously form zinc oxide. These operations were repeated two more times. The thin film that was formed was 0.15 µm in thickness and, as shown in FIG. 9, was confirmed to be zinc oxide by XRD. The 550 nm visible light transmittance was 87%. A transparent zinc oxide thin film with a transmittance of 80% or higher was thus obtained.

[Embodiment 2-2]

Figure 10:
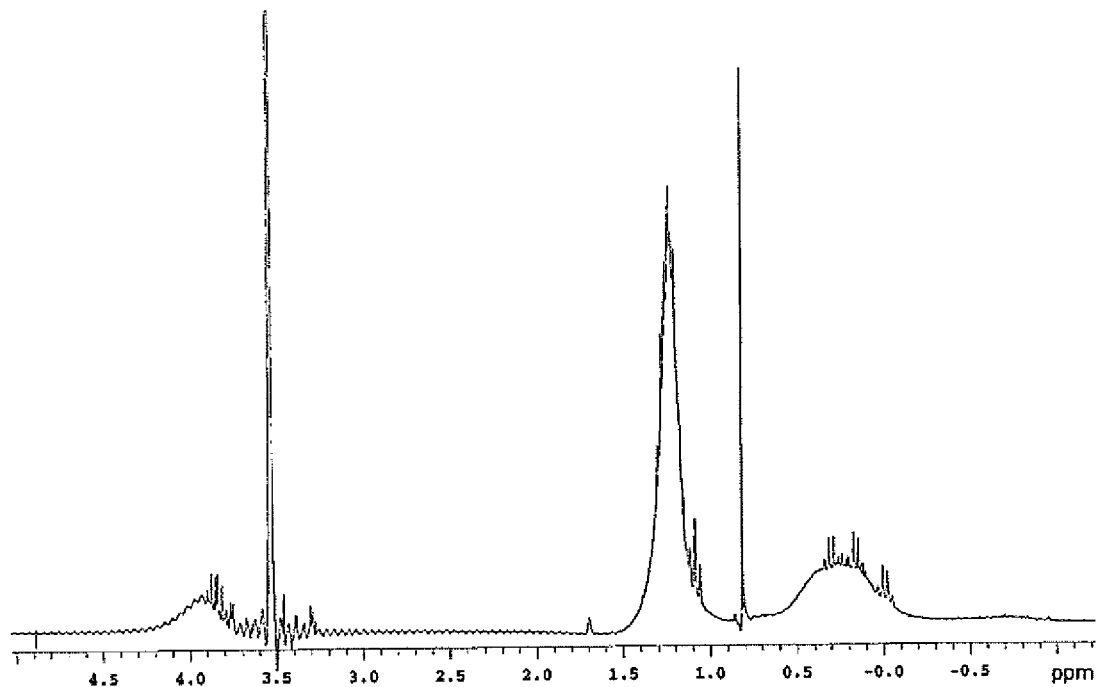
[FIG. 10] NMR spectrum of composition obtained in Embodiment 2-2 following vacuum drying.

With the exception that the triethylaluminum was replaced with trimethylgallium, 31.5 g of a partial hydrolysis product solution containing gallium (concentration 5.5 mass %) was obtained in the same manner as in Embodiment 2-1. NMR (THF-d8, ppm) measurement following removal of the solvent and the like by vacuum drying yielded the spectrum shown in FIG. 10.

Figure 11:
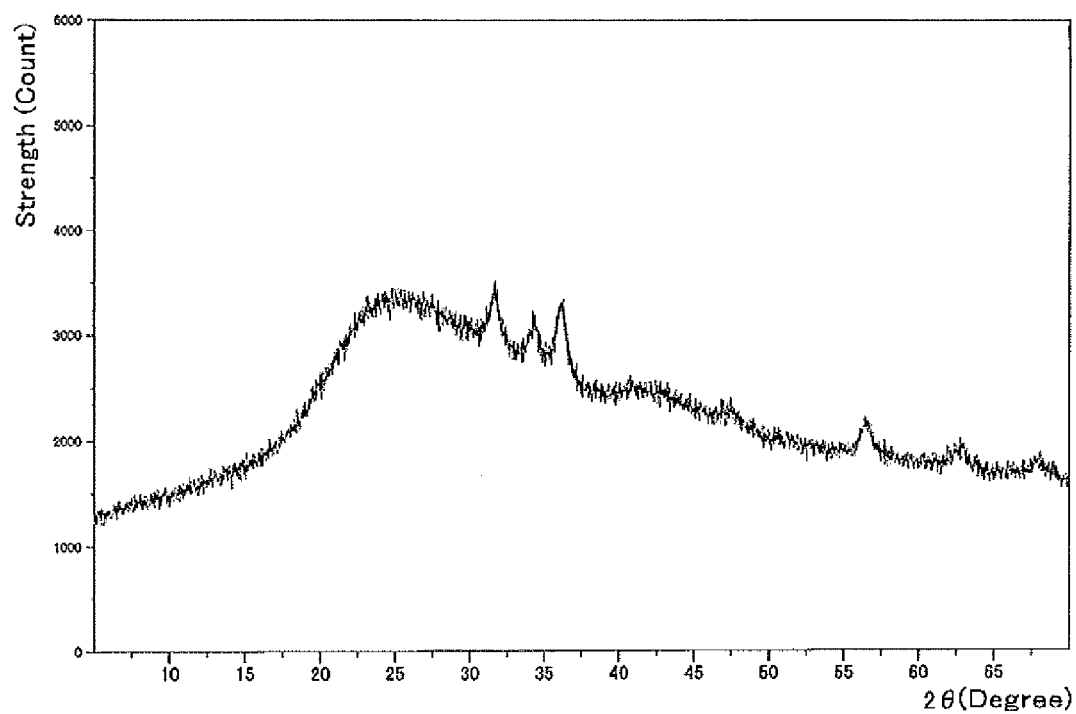
[FIG. 11] XRD spectrum of gallium-doped zinc oxide thin film obtained in Embodiment 2-2.

The product-containing coating liquid containing a partial hydrolysis product that was obtained as set forth above was coated in the same manner as in Embodiment 2-1. The thin film that was formed was 0.14 µm in thickness, and as shown in FIG. 11, was confirmed to be zinc oxide by XRD. The 550 nm visible light transmittance was 84%. A transparent zinc oxide thin film with a transmittance of 80% or higher was thus obtained.

[Embodiment 2-3]

Figure 12:
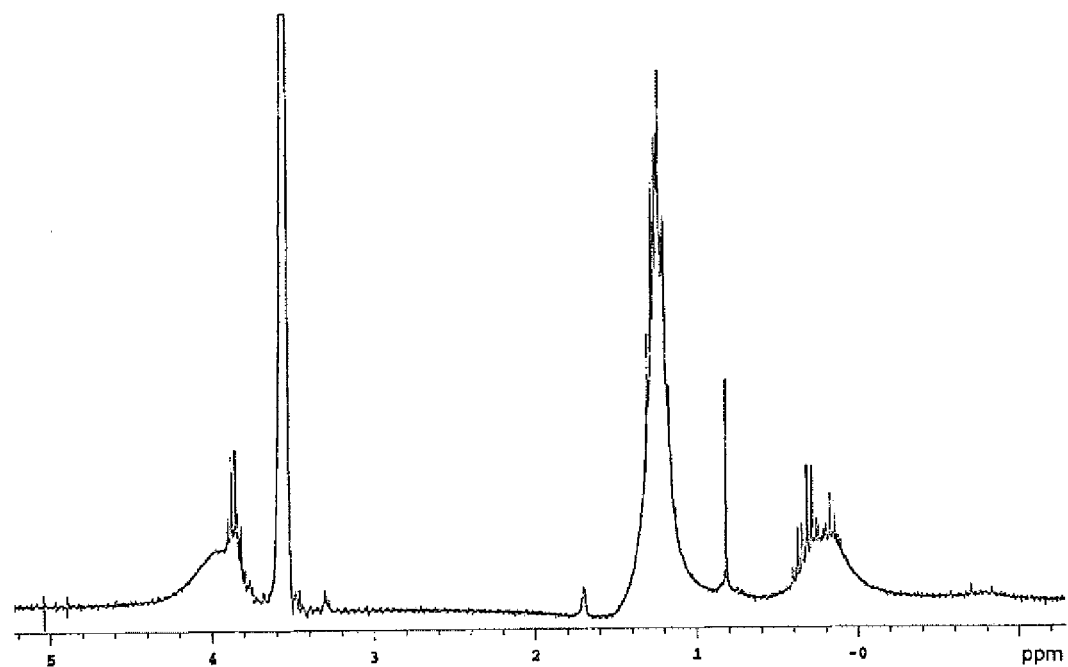
[FIG. 12] NMR spectrum of composition obtained in Embodiment 2-3 following vacuum drying.

With the exception that the triethylaluminum was replaced with trimethylindium, 32.3 g of a partial hydrolysis product solution containing indium (concentration 5.5 mass %) was obtained in the same manner as in Embodiment 2-1. NMR (THF-d8, ppm) measurement following removal of the solvent and the like by vacuum drying yielded the spectrum shown in FIG. 12.

Figure 13:
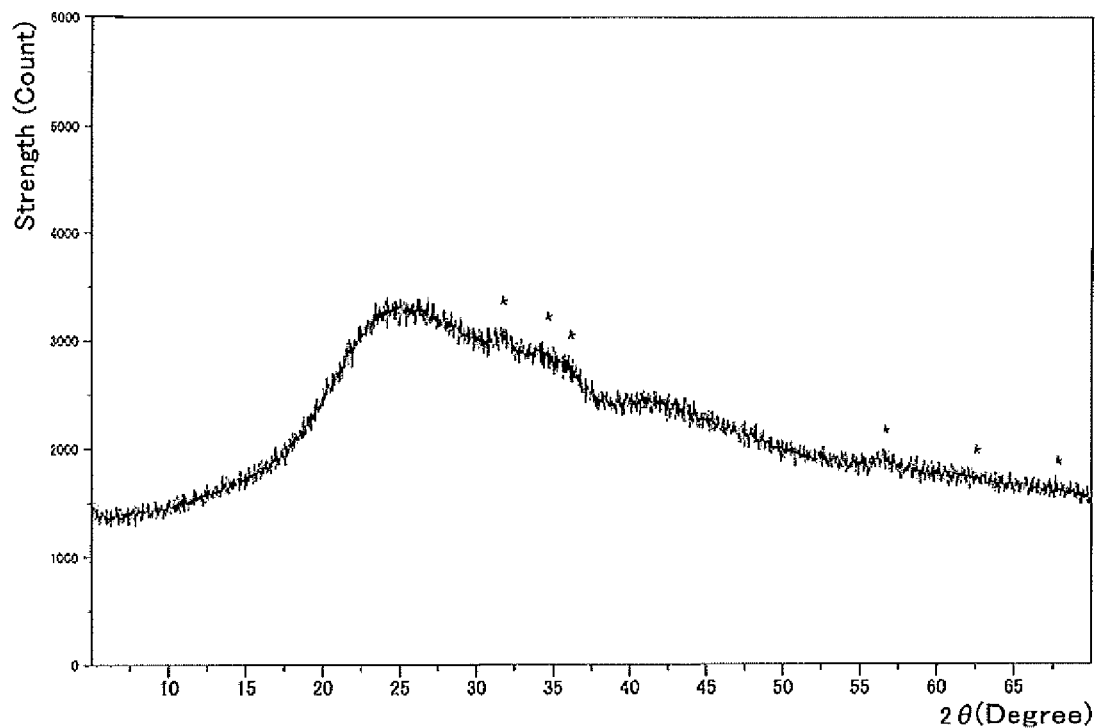
[FIG. 13] XRD spectrum of indium-doped zinc oxide thin film obtained in Embodiment 2-3.

With the exception that the substrate heating temperature was changed to 150° C., the product-containing coating liquid containing a partial hydrolysis product that was obtained as set forth above was coated in the same manner as in Embodiment 2-1. The thin film that was formed was 0.14 µm in thickness, and as shown in FIG. 13, was confirmed to be zinc oxide by XRD. The 550 nm visible light transmittance was 89%. A transparent zinc oxide thin film with a transmittance of 80% or higher was thus obtained.

[Comparative Example 2-1]

To 24.12 g of 2-methoxyethanol were added 1.23 g of zinc acetate dihydrate and an adjuvant in the form of 0.34 g of ethanolamine. Tris(acetylacetonato)aluminum was also added in a proportion yielding a molar ratio of 0.02 with the zinc acetate dihydrate. The mixture was thoroughly stirred to obtain a coating liquid.

With the exception that the coating liquid thus obtained was employed in air, a thin film was obtained by implementing the same operations as in Embodiment 2-1. The 550 nm visible light transmittance was 75%. Thus, only a non-transparent thin film with a transmittance of 80% or lower was obtained. The film was also nonuniform, and no peak derived from zinc oxide could be confirmed by XRD (not shown).

[Comparative Example 2-2]

With the exception that the tris(acetylacetonato) aluminum was replaced with gallium chloride, a coating liquid containing gallium was obtained in the same manner as in Comparative Example 2-1.

The coating liquid thus obtained was subjected to the same operations as in Comparative Example 2-1 to obtain a thin film. The 550 nm visible light transmittance was 66%. Thus, only a non-transparent thin film with a transmittance of 80% or lower was obtained. The film was also nonuniform, and no peak derived from zinc oxide could be confirmed by XRD (not shown).

[Comparative Example 2-3]

With the exception that the tris(acetylacetonato)-aluminum was replaced with indium chloride tetrahydrate, a coating liquid containing indium was obtained in the same manner as in Comparative Example 2-1.

The coating liquid thus obtained was subjected to the same operations as in Comparative Example 2-1 to obtain a thin film. The 550 nm visible light transmittance was 71%. Thus, only a non-transparent thin film with a transmittance of 80% or lower was obtained. The film was also nonuniform, and no peak derived from zinc oxide could be confirmed by XRD (not shown).

[Embodiment 2-4]

To 30.0 g of bis(2-methoxyethyl)ether were added 2.62 g of diethylzinc. The mixture was thoroughly stirred and then cooled to −12° C. A tetrahydrofuran solution containing 5.0% water was added dropwise to achieve a molar ratio of water to diethylzinc of 0.6. Subsequently, the mixture was heated to room temperature (22° C.) and reacted at room temperature for 18 hours. The solution thus obtained was passed through a membrane filter to obtain 33.1 g of a partial hydrolysis product solution (concentration 7.8 mass %). The solvent and the like were removed by vacuum drying, after which the spectrum shown in FIG. 14 was obtained by NMR (THF-d8, ppm) measurement.

The product-containing coating liquid containing a partial hydrolysis product obtained as set forth above was spin coated on the surface of an 18 mm square Corning 1737 glass substrate. Subsequently, the substrate was heated to 120° C. for 4 minutes to dry the solvent and simultaneously form zinc oxide. These operations were repeated five more times. The thin film that was formed was 0.36 µm in thickness and was confirmed to be zinc oxide by XRD. The 550 nm visible light transmittance was 93%. A transparent zinc oxide thin film with a transmittance of 80% or higher was thus obtained.

[Embodiment 2-5]

To the partial hydrolysis product solution of diethylzinc prepared in Embodiment 2-4, trioctylaluminum was added to achieve a molar ratio of 0.01 to the diethylzinc that had been charged, yielding 33.2 g of a partial hydrolysis product solution containing aluminum.

The product-containing coating liquid containing a partial hydrolysis product obtained as set forth above was spin coated on the surface of an 18 mm square Corning 1737 glass substrate. Subsequently, the substrate was heated to 120° C. for 4 minutes to dry the solvent and simultaneously form zinc oxide. These operations were repeated five more times. The thin film that was formed was 0.33 µm in thickness and was confirmed to be zinc oxide by XRD. The 550 nm visible light transmittance was 93%. A transparent zinc oxide thin film with a transmittance of 80% or higher was thus obtained.

[Embodiment 2-6]

To the partial hydrolysis product solution of diethylzinc prepared in Embodiment 2-4, trimethylgallium was added to achieve a molar ratio of 0.03 relative to the diethylzinc that had been charged, yielding 33.0 g of a partial hydrolysis product solution containing gallium.

The product-containing coating liquid containing a partial hydrolysis product obtained as set forth above was spin coated on the surface of an 18 mm square Corning 1737 glass substrate. Subsequently, the substrate was heated to 120° C. for 4 minutes to dry the solvent and simultaneously form zinc oxide. These operations were repeated five more times. The thin film that was formed was 0.35 µm in thickness and was confirmed to be zinc oxide by XRD. The 550 nm visible light transmittance was 94%. A transparent zinc oxide thin film with a transmittance of 80% or higher was thus obtained.

[Embodiment 2-7]

To the partial hydrolysis product solution of diethylzinc prepared in Embodiment 2-4, trimethylindium was added to achieve a molar ratio of 0.03 to the diethylzinc that had been charged, yielding 32.8 g of a partial hydrolysis product solution containing indium.

The product-containing coating liquid containing a partial hydrolysis product obtained as set forth above was spin coated on the surface of an 18 mm square Corning 1737 glass substrate. Subsequently, the substrate was heated to 120° C. for 4 minutes to dry the solvent and simultaneously form zinc oxide. These operations were repeated five more times. The thin film that was formed was 0.32 µm in thickness and was confirmed to be zinc oxide by XRD. The 550 nm visible light transmittance was 94%. A transparent zinc oxide thin film with a transmittance of 80% or higher was thus obtained.

[Embodiment 2-8]

Figure 15:
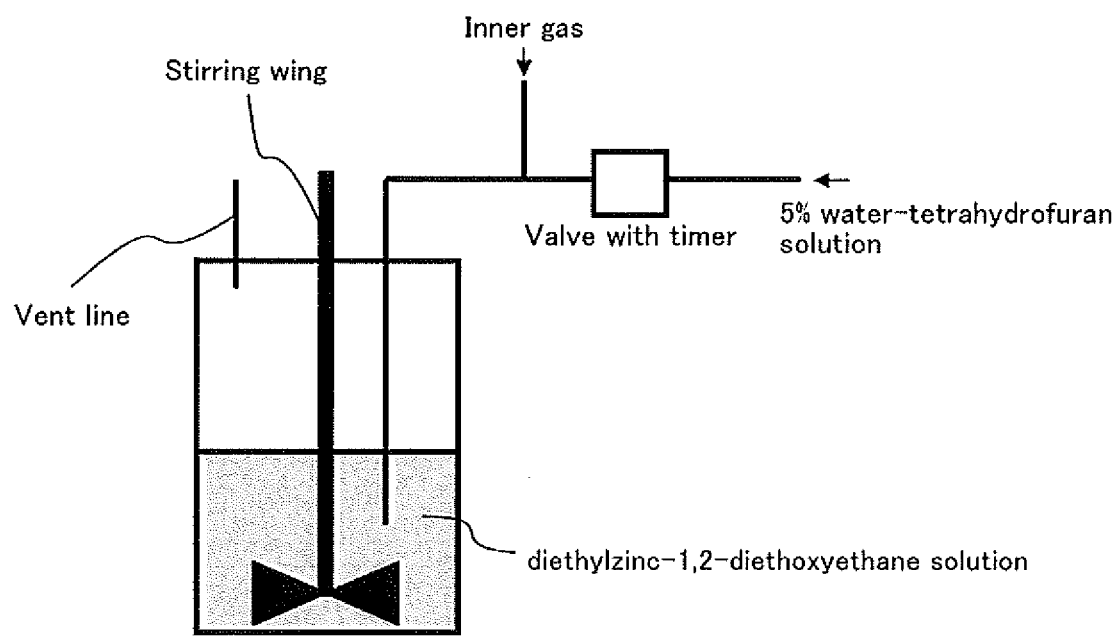
[FIG. 15] Descriptive drawing of apparatus employed in Embodiment 2-8.
Figure 16:
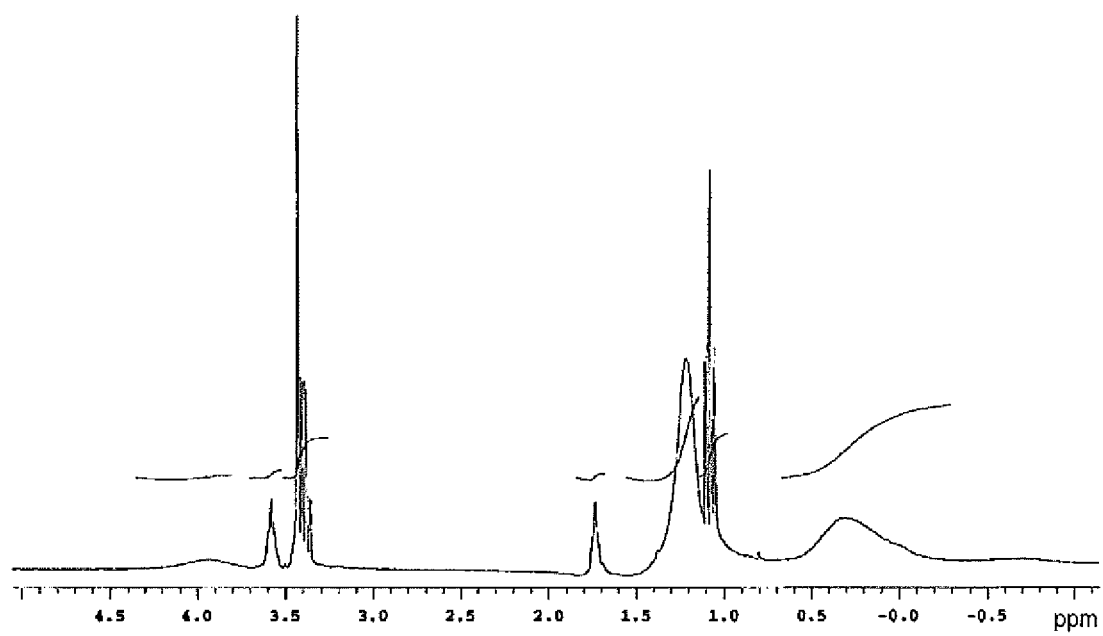
[FIG. 16] NMR spectrum of composition obtained in Embodiment 2-8 following vacuum drying.

To 30.0 g of 1,2-diethoxyethane were added 1.97 g of diethylzinc. The mixture was thoroughly stirred and then cooled to –12° C. A tetrahydrofuran solution containing 5.0% water was added dropwise to achieve a molar ratio of water to diethylzinc of 0.8 by intermittent introduction using an apparatus such as that shown in FIG. 15. Subsequently, the mixture was heated to room temperature (22° C.) and reacted at room temperature for 18 hours. The solution thus obtained was passed through a membrane filter to obtain 33.1 g of a partial hydrolysis product solution (concentration 7.8 mass %). The solvent and the like were removed by vacuum drying, after which the spectrum shown in FIG. 16 was obtained by NMR (THF-d8, ppm) measurement.

[Embodiment 3-1]

To 39.9 g of 1,2-diethoxyethane (boiling point 121° C.) were added 3.49 g (equivalent to 8.7 mass %) of diethylzinc. The mixture was thoroughly stirred and then cooled to –12° C. A 1,4-dioxane (boiling point 101.1° C.) solution containing 5.0% water was added dropwise (total quantity added: 6.02 g) to achieve a molar ratio of water to diethylzinc of 0.6. Subsequently, the mixture was heated to room temperature (24° C.) and reacted at room temperature for 18 hours. The solution thus obtained was passed through a membrane filter to obtain 48.1 g of a partial hydrolysis product solution (concentration 6.5 mass %). The solvent and the like were removed by vacuum drying, after which the spectrum shown in FIG. 15 was obtained by NMR (THF-d8, ppm) measurement.

The product-containing coating liquid containing a partial hydrolysis product obtained as set forth above was spin coated on the surface of an 18 mm square Corning 1737 glass substrate. Subsequently, the substrate was heated to 500° C. for 4 minutes to dry the solvent and simultaneously form zinc oxide. These operations were repeated five more times. The thin film that was formed had a surface resistance of 1,300Ω/□, a thickness of 0.35 µm, a volume resistance of 4.6×10$^{-2}$ Ω·cm, and was confirmed to be zinc oxide by XRD (see FIG. 16). The 550 nm visible light transmittance was 90%. A transparent zinc oxide thin film with a transmittance of 80% or higher was thus obtained.

[Embodiment 3-2]

To the partial hydrolysis product solution of diethylzinc prepared in Embodiment 3-1, trimethylindium was added to achieve a molar ratio of 0.03 to the diethylzinc that had been charged, yielding 488.1 g of a partial hydrolysis product solution containing indium.

The product-containing coating liquid containing a partial hydrolysis product obtained as set forth above was spin coated on the surface of an 18 mm square Corning 1737 glass substrate. Subsequently, the substrate was heated to 500° C. for 4 minutes to dry the solvent and simultaneously form zinc oxide. These operations were repeated five more times. The thin film that was formed had a surface resistance of 587Ω/□, a thickness of 0.37 µm, a volume resistance of 2.2×10$^{-2}$ Ω·cm, and was confirmed to be zinc oxide by XRD (see FIG. 16). The 550 nm visible light transmittance was 91%. A transparent zinc oxide thin film with a transmittance of 80% or higher was thus obtained.

[Embodiment 3-3]

The product-containing coating liquid containing a partial hydrolysis product obtained as set forth in Embodiment 3-2 was spin coated on the surface of an 18 mm square Corning 1737 glass substrate. Subsequently, the substrate was heated to 500° C. for 4 minutes to dry the solvent and simultaneously form zinc oxide. These operations were repeated 30 more times. The thin film that was formed had a surface resistance of 55Ω/□, a thickness of 1.71 µm, a volume resistance of 9.4×10$^{-3}$ Ω·cm, and was confirmed to be zinc oxide by XRD (see FIG. 16). The 550 nm visible light transmittance was 85%. A transparent zinc oxide thin film with a transmittance of 80% or higher was thus obtained.

[Embodiment 3-4]

To 200.3 g of 1,2-diethoxyethane (boiling point 121° C.) were added 17.45 g (equivalent to 8.7 mass %) of diethylzinc. The mixture was thoroughly stirred and then cooled to –12° C. A tetrahydrofuran (boiling point 66° C.) solution containing 5.0% water was added dropwise (total quantity added: 30.1 g) to achieve a molar ratio of water to diethylzinc of 0.6. Subsequently, the mixture was heated to room temperature (24° C.) and reacted at room temperature for 18 hours. The solution thus obtained was passed through a membrane filter to obtain 245.2 g of a partial hydrolysis product solution (concentration 6.4 mass %). Trimethylindium was added to the partial hydrolysis production solution thus obtained to achieve a molar ratio of 0.01 to the diethylzinc that had been charged, yielding 245.3 g of a partial hydrolysis product solution containing indium.

Figure 14:
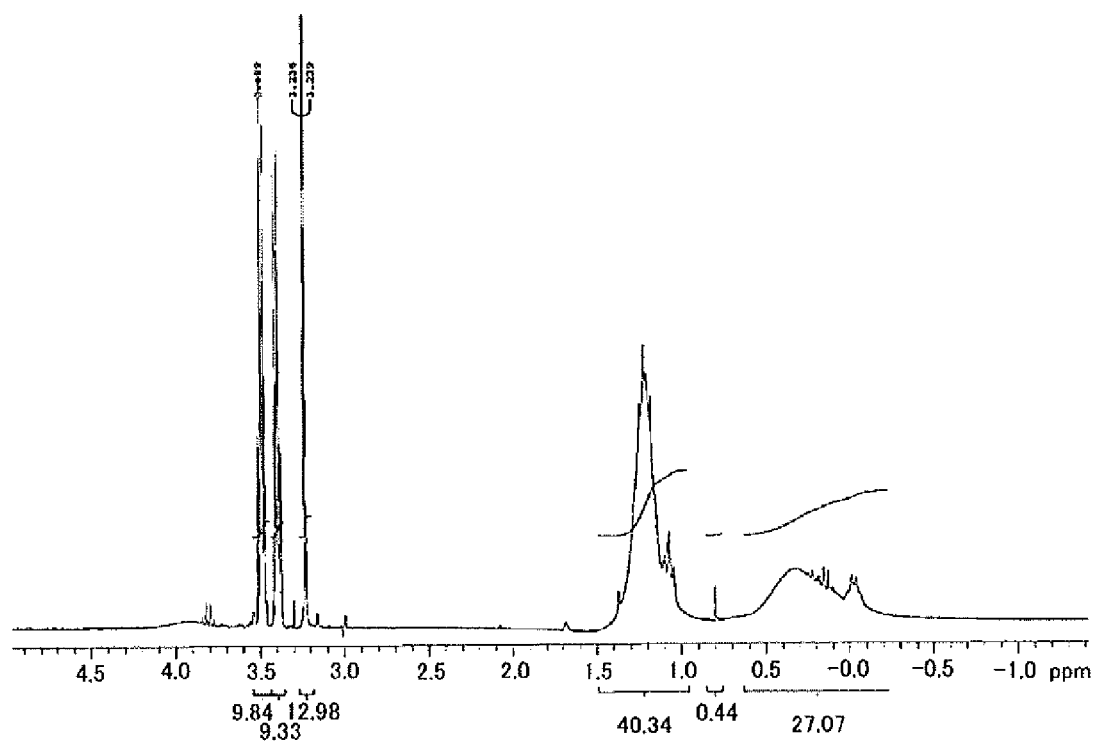
[FIG. 14] NMR spectrum of composition obtained in Embodiment 2-4 following vacuum drying.

The coating liquid obtained as set forth above was loaded into a spray bottle in the spray film-forming apparatus of FIG. 14. An 18 mm square Corning 1737 glass substrate was placed in the substrate holder. After heating the glass substrate to 400° C. in a nitrogen gas atmosphere, nitrogen gas that had been bubbled through 24° C. water at a rate of 16 L per minute was introduced in the vicinity of the substrate through water vapor introduction tube 6 to introduce water. Subsequently, the coating liquid was sprayed for 16 minutes through a spray nozzle at a rate of 4 mL/minute. The liquid droplets sprayed through the spray nozzle ranged in size from 3 to 20 µm. A distance of 30 cm was maintained between the spray nozzle and the substrate. The thin film that was formed had a surface resistance of 15Ω/□, a thickness of 0.49 µm, a volume resistance of 7.4×10$^{-4}$ Ω·cm, and was confirmed to be zinc oxide by XRD (see FIG. 17). The 550 nm visible light transmittance was 83%. A transparent zinc oxide thin film with a transmittance of 80% or higher was thus obtained.

[Embodiment 3-5]

The zinc oxide thin films obtained in Embodiments 3-1 to 3-4 were confirmed to have an antistatic function and to be suitable for use as antistatic thin films. The zinc oxide thin films obtained in Embodiments 3-1 to 3-4 were confirmed to have a UV-cutting function and to be suitable for use as UV-cutting thin films.

[Embodiment 3-6]

The zinc oxide thin film obtained in Embodiment 3-4 was confirmed to function as a transparent electrode and to be suitable for use as a transparent electrode thin film.

[Reference Example 3-1]

To 40.0 g of 1,2-diethoxyethane were added 1.26 g (equivalent to 3.15 mass %) of diethylzinc. The mixture was thoroughly stirred and then cooled to −12° C. A 1,4-dioxane solution containing 5.0% water was added dropwise (total quantity added: 2.06 g) to achieve a molar ratio of water to diethylzinc of 0.6. Subsequently, the mixture was heated to room temperature (24° C.) and reacted at room temperature for 18 hours. The solution thus obtained was passed through a membrane filter to obtain 43.1 g of a partial hydrolysis product solution (concentration 2.7 mass %).

The product-containing coating liquid containing a partial hydrolysis product obtained as set forth above was spin coated on the surface of an 18 mm square Corning 1737 glass substrate. Subsequently, the substrate was heated to 500° C. for 4 minutes to dry the solvent. These operations were repeated 5 more times. However, the thin film that was formed had a surface resistance of >$10^7$ Ω/□ (falling outside the measurement range) and a 550 nm visible light transmittance of 16%. Only a non-transparent, high resistance thin film with a transmittance of 80% or lower was thus obtained.

[Reference Example 3-2]

To 39.9 g of 1,2-diethoxyethane were added 6.53 g (equivalent to 16.4 mass %) of diethylzinc. The mixture was thoroughly stirred and then cooled to −12° C. A 1,4-dioxane solution containing 5.0% water was added dropwise (total quantity added: 9.83 g) to achieve a molar ratio of water to diethylzinc of 0.6. Subsequently, the mixture was heated to room temperature (24° C.) and reacted at room temperature for 18 hours. The solution thus obtained was passed through a membrane filter to obtain 83.5 g of a partial hydrolysis product solution (concentration 12.5 mass %).

The product-containing coating liquid containing a partial hydrolysis product obtained as set forth above was spin coated on the surface of an 18 mm square Corning 1737 glass substrate. Subsequently, the substrate was heated to 500° C. for 4 minutes to dry the solvent. These operations were repeated 5 more times. However, the thin film that was formed had a surface resistance of >$10^7$ Ω/□ (falling outside the measurement range) and a 550 nm visible light transmittance of 88%. Only a high resistance thin film was thus obtained.

[Reference Example 3-3]

To 39.9 g of tetrahydrofuran (boiling point 66° C.) were added 3.50 g of diethylzinc (equivalent to 8.7 mass %). The mixture was thoroughly stirred and then cooled to −12° C. A tetrahydrofuran solution containing 5.0% water was added dropwise (total quantity added: 6.01 g) to achieve a molar ratio of water to diethylzinc of 0.6. Subsequently, the mixture was heated to room temperature (24° C.), reacted for 18 hours at room temperature, and passed through a membrane filter to obtain 43.9 g of a partial hydrolysis product solution (concentration 6.6 mass %).

Figure 18:
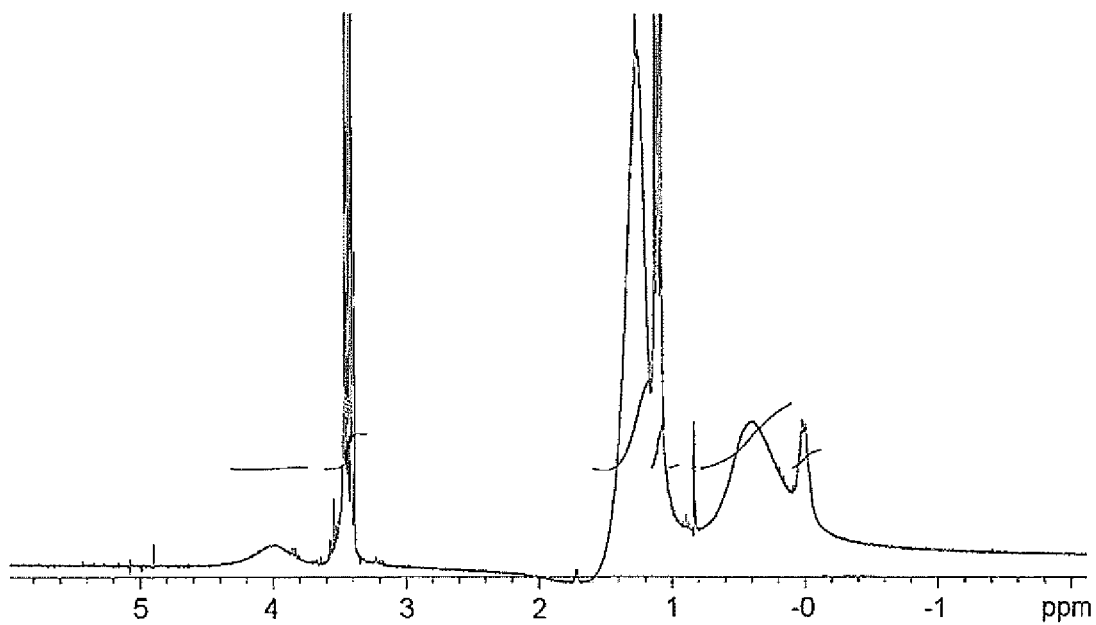
[FIG. 18] NMR spectrum of composition obtained in Embodiment 3-1 following vacuum drying.
Figure 19:
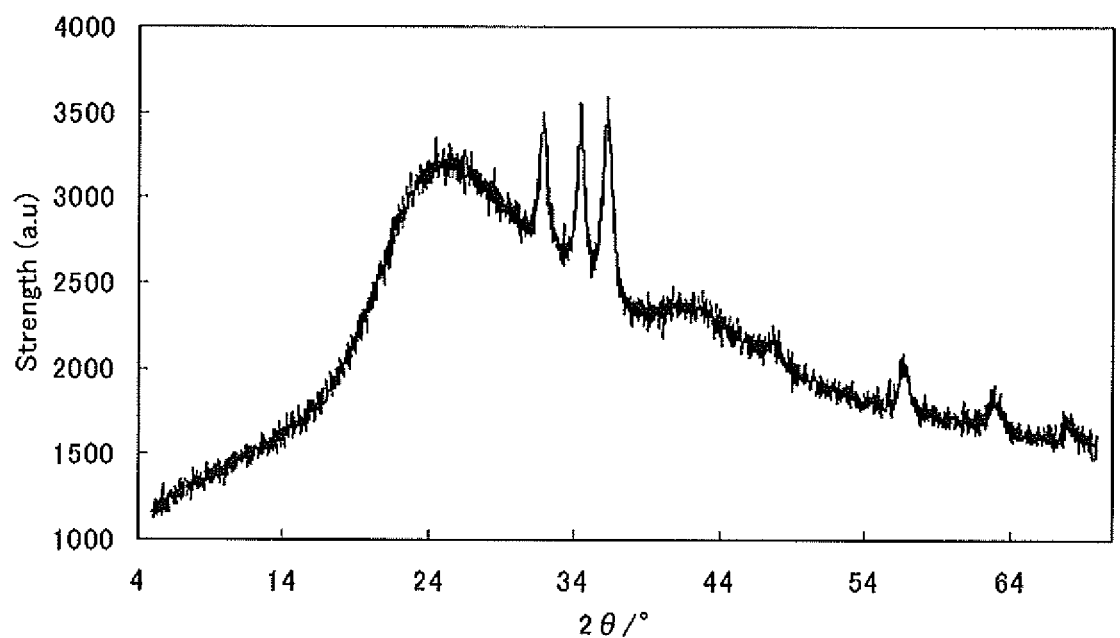
[FIG. 19] XRD spectrum of zinc oxide thin film obtained in Embodiment 3-1.
Figure 20:
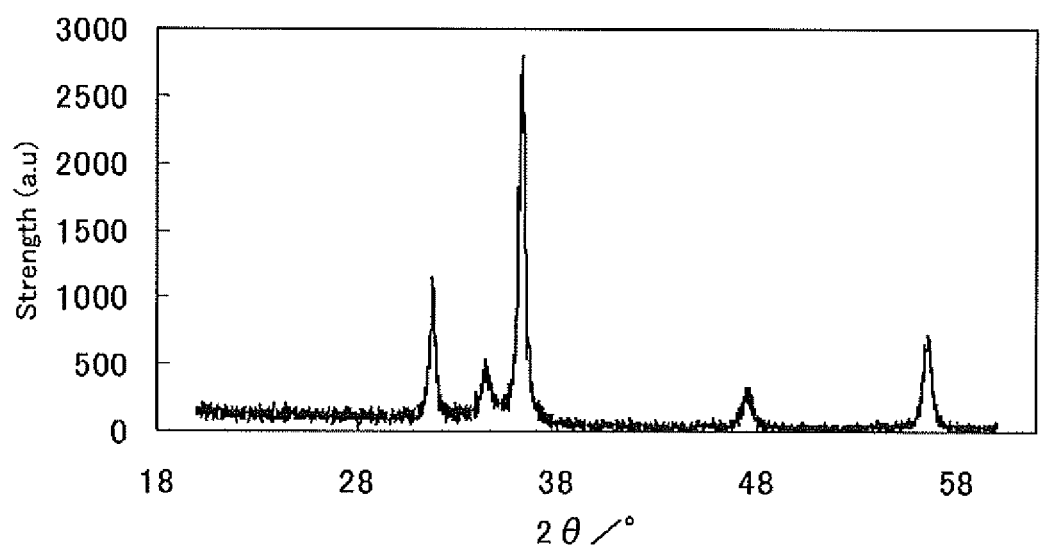
[FIG. 20] XRD spectrum of zinc oxide thin film obtained in Embodiment 3-4.
Figure 21:
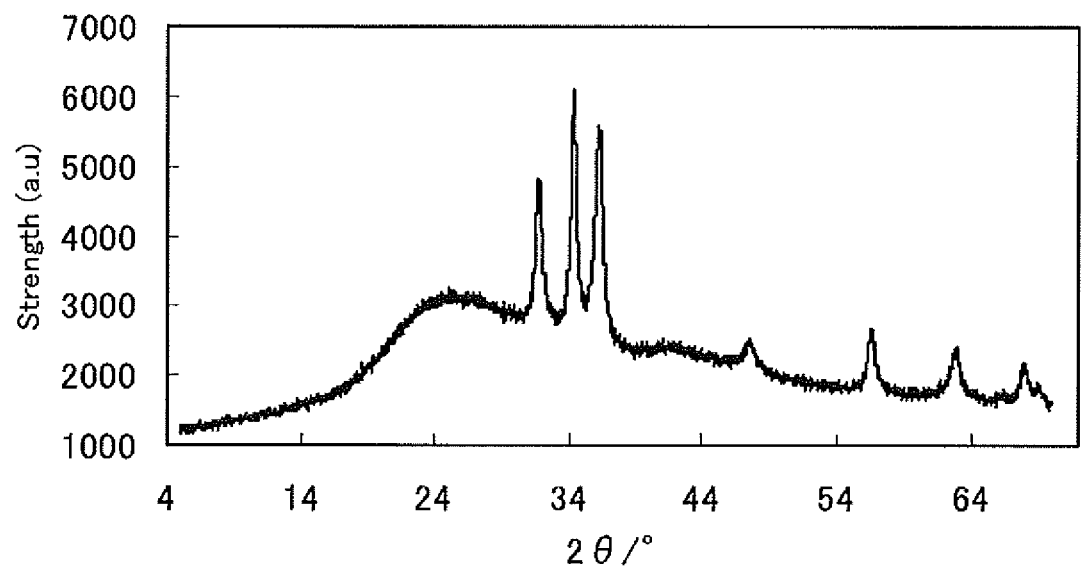
[FIG. 21] XRD spectrum of zinc oxide thin film obtained in Reference Embodiment 3-3.

The product-containing coating liquid containing a partial hydrolysis product obtained as set forth above was spin coated on the surface of an 18 mm square Corning 1737 glass substrate. Subsequently, the substrate was heated to 500° C. for 4 minutes to dry the solvent and simultaneously form zinc oxide. The above operations were repeated two more times. The thin film that was formed had a surface resistance of $2.2 \times 10^5$ Ω/□ and a 550 nm visible light transmittance of 4%. Thus, only an opaque thin film was obtained. The fact that zinc formed in addition to zinc oxide was confirmed by XRD, as shown in FIG. 18.

[Reference Example 3-4]

The coating liquid obtained as set forth above was loaded into a spray bottle in the spray film-forming apparatus of FIG. 14. An 18 mm square Corning 1737 glass substrate was placed in the substrate holder. The glass substrate was heated to 400° C. in a nitrogen gas atmosphere. Subsequently, without introducing water vapor, the coating liquid was sprayed for 16 minutes through a spray nozzle at a rate of 4 ml/minute. The thin film that was formed had a surface resistance of 3,590 Ω/□, a thickness of 0.31 μm, and a 550 nm visible light transmittance of 13%. Thus, only a non-transparent and high resistance thin film was obtained.

[Reference Example 3-5]

To 500.0 g of 1,4-dioxane (boiling point 101.1° C.) were added 43.5 g (equivalent to 8.0 mass %) of diethylzinc. The mixture was thoroughly stirred and then cooled to −12° C. A 1,4-dioxane (boiling point 101.1° C.) solution containing 5.0% water was added dropwise (total quantity added: 77.4 g) to achieve a molar ratio of water to diethylzinc of 0.6. Subsequently, the mixture was heated to room temperature (24° C.), reacted for 18 hours at room temperature, and passed through a membrane filter to obtain 616.8 g of a partial hydrolysis product solution (concentration 6.5 mass %). To the partial hydrolysis product solution was added trimethylindium to achieve a molar ratio of 0.01 to the diethylzinc that had been charged, yielding 617.2 g of a partial hydrolysis product solution containing indium.

The product-containing coating liquid containing a partial hydrolysis product obtained as set forth above was spin coated on the surface of an 18 mm square Corning 1737 glass substrate. Subsequently, the substrate was heated to 500° C. for 4 minutes to dry the solvent. The above operations were repeated two more times. However, the thin film that was formed had a surface resistance of $1.9 \times 10^5$ Ω/□, a thickness of 0.37 μm, a volume resistivity of $4.8 \times 10^{-1}$ Ω·cm, and a 550 nm visible light transmittance of 95%. Thus, only a high resistance thin film was obtained.

[Reference Example 3-6]

The product-containing coating liquid containing a partial hydrolysis product obtained as set forth in Reference Example 5 was spin coated on the surface of an 18 mm square Corning 1737 glass substrate. Subsequently, the substrate was heated to 500° C. for 4 minutes to dry the solvent. The above operations were repeated five more times. However, the thin film that was formed had a surface resistance of $9.3 \times 10^4$ Ω/□, a thickness of 0.35 μm, a volume resistivity of $3.2 \times 10^{-1}$ Ω·cm, and a 550 nm visible light transmittance of 67%. Thus, only a high resistance, non-transparent thin film was obtained.

[Embodiment 3-7]

Figure 22:
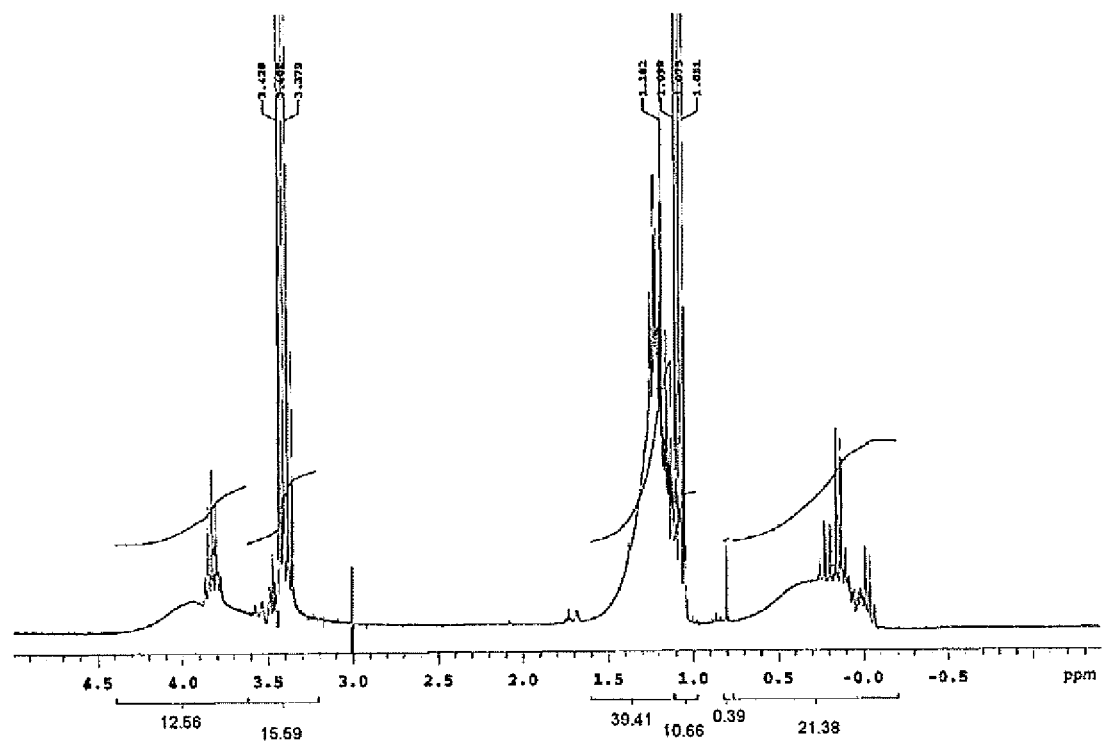
[FIG. 22] NMR spectrum of composition obtained in Embodiment 3-7 following vacuum drying.

To 39.9 g of 1,2-diethoxyethane (boiling point 121° C.) were added 3.49 g (equivalent to 8.7 mass %) of diethylzinc. The mixture was thoroughly stirred and then cooled to −12° C. A tetrahydrofuran (boiling point 66.0° C.) solution containing 5.0% water was added dropwise (total quantity added: 6.11 g) to achieve a molar ratio of water to diethylzinc of 0.6. Subsequently, the mixture was heated to room temperature (24° C.), reacted for 18 hours at room temperature, and passed through a membrane filter to obtain 48.6 g of a partial hydrolysis product solution (concentration 6.5 mass %). The spectrum of FIG. 22 was obtained by NMR (THF-d8, ppm) after removing the solvent and the like by vacuum drying.

The product-containing coating liquid containing a partial hydrolysis product obtained as set forth above was spin coated on the surface of an 18 mm square Corning 1737 glass substrate. Subsequently, the substrate was heated to 500° C. for 4 minutes to dry the solvent and simultaneously form zinc oxide. The above operations were repeated five more times. The thin film that was formed had a surface resistance of 1050Ω/□, a thickness of 0.35 µm, and a volume resistivity of $3.7 \times 10^{-2}$ Ω·cm. The thin film was confirmed to be zinc oxide by XRD. The 550 nm visible light transmittance was 89%. A transparent zinc oxide thin film with a transmittance of 80% or higher was thus obtained.

[Embodiment 3-8]

To the partial hydrolysis production solution of diethylzinc prepared in Embodiment 3-7 was added trimethylgallium to achieve a 0.03 molar ratio to the diethylzinc that had been charged, yielding 48.7 g of a partial hydrolysis product solution containing gallium.

The product-containing coating liquid containing a partial hydrolysis product obtained as set forth above was spin coated on the surface of an 18 mm square Corning 1737 glass substrate. Subsequently, the substrate was heated to 500° C. for 4 minutes to dry the solvent and simultaneously form zinc oxide. The above operations were repeated five more times. The thin film that was formed had a surface resistance of 420Ω/□, a thickness of 0.37 µm, and a volume resistivity of $1.6 \times 10^{-2}$ Ω·cm. The thin film was confirmed to be zinc oxide by XRD. The 550 nm visible light transmittance was 92%. A transparent zinc oxide thin film with a transmittance of 80% or higher was thus obtained.

[Embodiment 3-9]

To the partial hydrolysis production solution of diethylzinc prepared in Embodiment 3-7 was added trioctylaluminum to achieve a 0.01 molar ratio to the diethylzinc that had been charged, yielding 48.7 g of a partial hydrolysis product solution containing aluminum.

The product-containing coating liquid containing a partial hydrolysis product obtained as set forth above was spin coated on the surface of an 18 mm square Corning 1737 glass substrate. Subsequently, the substrate was heated to 500° C. for 4 minutes to dry the solvent and simultaneously form zinc oxide. The above operations were repeated 29 more times. The thin film that was formed had a surface resistance of 44Ω/□, a thickness of 1.91 µm, and a volume resistivity of $8.4 \times 10^{-3}$ Ω·cm. The thin film was confirmed to be zinc oxide by XRD. The 550 nm visible light transmittance was 84%. A transparent zinc oxide thin film with a transmittance of 80% or higher was thus obtained.

[Embodiment 3-10]

To the partial hydrolysis production solution of diethylzinc prepared in Embodiment 3-7 was added a 0.5 M hydrogenated aluminum-triethylamine complex toluene solution to achieve a 0.01 molar ratio to the diethylzinc that had been charged, yielding 48.4 g of a partial hydrolysis product solution containing aluminum.

The product-containing coating liquid containing a partial hydrolysis product obtained as set forth above was spin coated on the surface of an 18 mm square Corning 1737 glass substrate. Subsequently, the substrate was heated to 500° C. for 4 minutes to dry the solvent and simultaneously form zinc oxide. The above operations were repeated 29 more times. The thin film that was formed had a surface resistance of 57Ω/□, a thickness of 1.86 µm, and a volume resistivity of $1.1 \times 10^{-2}$ Ω·cm. The thin film was confirmed to be zinc oxide by XRD. The 550 nm visible light transmittance was 84%. A transparent zinc oxide thin film with a transmittance of 80% or higher was thus obtained.

[Embodiment 3-11]

To the partial hydrolysis product solution of diethylzinc prepared in Embodiment 3-7 was added trimethylgallium to achieve a 0.03 molar ratio to the diethylzinc that had been charged, yielding 48.5 g of a partial hydrolysis product solution containing gallium.

The product-containing coating liquid containing a partial hydrolysis product obtained as set forth above was spin coated on the surface of an 18 mm square Corning 1737 glass substrate. Subsequently, the substrate was heated to 500° C. for 4 minutes to dry the solvent and simultaneously form zinc oxide. The above operations were repeated 29 more times. The thin film that was formed had a surface resistance of 62Ω/□, a thickness of 1.74 µm, and a volume resistivity of $1.1 \times 10^{-2}$ Ω·cm. The thin film was confirmed to be zinc oxide by XRD. The 550 nm visible light transmittance was 91%. A transparent zinc oxide thin film with a transmittance of 80% or higher was thus obtained.

[Embodiment 3-12]

To the partial hydrolysis production solution of diethylzinc prepared in Embodiment 3-7 was added triethylgallium to achieve a 0.03 molar ratio to the diethylzinc that had been charged, yielding 48.2 g of a partial hydrolysis product solution containing gallium.

The product-containing coating liquid containing a partial hydrolysis product obtained as set forth above was spin coated on the surface of an 18 mm square Corning 1737 glass substrate. Subsequently, the substrate was heated to 500° C. for 4 minutes to dry the solvent and simultaneously form zinc oxide. The above operations were repeated 29 more times. The thin film that was formed had a surface resistance of 40Ω/□, a thickness of 1.66 µm, and a volume resistivity of $6.6 \times 10^{-3}$ Ω·cm. The thin film was confirmed to be zinc oxide by XRD. The 550 nm visible light transmittance was 92%. A transparent zinc oxide thin film with a transmittance of 80% or higher was thus obtained.

[Embodiment 3-13]

To the partial hydrolysis production solution of diethylzinc prepared in Embodiment 3-7 was added gallium chloride to achieve a 0.03 molar ratio to the diethylzinc that had been charged, yielding 48.6 g of a partial hydrolysis product solution containing gallium.

The product-containing coating liquid containing a partial hydrolysis product obtained as set forth above was spin coated on the surface of an 18 mm square Corning 1737 glass substrate. Subsequently, the substrate was heated to 500° C. for 4 minutes to dry the solvent and simultaneously form zinc oxide. The above operations were repeated 29 more times. The thin film that was formed had a surface resistance of 38Ω/□, a thickness of 1.66 µm, and a volume resistivity of $6.6 \times 10^{-3}$ Ω·cm. The thin film was confirmed to be zinc oxide by XRD. The 550 nm visible light transmittance was 90%. A transparent zinc oxide thin film with a transmittance of 80% or higher was thus obtained.

[Embodiment 3-14]

To the partial hydrolysis production solution of diethylzinc prepared in Embodiment 3-7 was added indium chloride to achieve a 0.03 molar ratio to the diethylzinc that had been charged, yielding 48.3 g of a partial hydrolysis product solution containing indium.

The product-containing coating liquid containing a partial hydrolysis product obtained as set forth above was spin coated on the surface of an 18 mm square Corning 1737 glass substrate. Subsequently, the substrate was heated to 500° C. for 4 minutes to dry the solvent and simultaneously form zinc oxide. The above operations were repeated 29 more times. The thin film that was formed had a surface resistance of 35Ω/□, a thickness of 1.76 μm, and a volume resistivity of 6.6×10⁻³Ω·cm. The thin film was confirmed to be zinc oxide by XRD. The 550 nm visible light transmittance was 92%. A transparent zinc oxide thin film with a transmittance of 80% or higher was thus obtained.

[Embodiment 3-15]

To the partial hydrolysis production solution of diethylzinc prepared in Embodiment 3-7 was added tris(acetylacetonato) gallium to achieve a 0.03 molar ratio to the diethylzinc that had been charged, yielding 48.4 g of a partial hydrolysis product solution containing gallium.

The product-containing coating liquid containing a partial hydrolysis product obtained as set forth above was spin coated on the surface of an 18 mm square Corning 1737 glass substrate. Subsequently, the substrate was heated to 500° C. for 4 minutes to dry the solvent and simultaneously form zinc oxide. The above operations were repeated 29 more times. The thin film that was formed had a surface resistance of 41Ω□, a thickness of 1.63 μm, and a volume resistivity of 6.7×10⁻³Ω·cm. The thin film was confirmed to be zinc oxide by XRD. The 550 nm visible light transmittance was 91%. A transparent zinc oxide thin film with a transmittance of 80% or higher was thus obtained.

[Embodiment 3-16]

To the partial hydrolysis production solution of diethylzinc prepared in Embodiment 3-7 was added tris(acetylacetonato) indium to achieve a 0.03 molar ratio to the diethylzinc that had been charged, yielding 48.2 g of a partial hydrolysis product solution containing indium.

The product-containing coating liquid containing a partial hydrolysis product obtained as set forth above was spin coated on the surface of an 18 mm square Corning 1737 glass substrate.

Subsequently, the substrate was heated to 500° C. for 4 minutes to dry the solvent and simultaneously form zinc oxide. The above operations were repeated 29 more times. The thin film that was formed had a surface resistance of 42Ω/□, a thickness of 1.61 μm, and a volume resistivity of 6.8×10⁻³Ω·cm. The thin film was confirmed to be zinc oxide by XRD. The 550 nm visible light transmittance was 94%. A transparent zinc oxide thin film with a transmittance of 80% or higher was thus obtained.

[Embodiment 3-17]

To the partial hydrolysis production solution of diethylzinc prepared in Embodiment 3-7 was added indium acetate to achieve a 0.03 molar ratio to the diethylzinc that had been charged, yielding 48.5 g of a partial hydrolysis product solution containing indium.

The product-containing coating liquid containing a partial hydrolysis product obtained as set forth above was spin coated on the surface of an 18 mm square Corning 1737 glass substrate. Subsequently, the substrate was heated to 500° C. for 4 minutes to dry the solvent and simultaneously form zinc oxide. The above operations were repeated 29 more times. The thin film that was formed had a surface resistance of 38Ω/□, a thickness of 1.60 μm, and a volume resistivity of 6.1×10⁻¹Ω·cm. The thin film was confirmed to be zinc oxide by XRD. The 550 nm visible light transmittance was 92%. A transparent zinc oxide thin film with a transmittance of 80% or higher was thus obtained.

[Industrial Applicability]

The present invention is useful in the area of manufacturing doped and undoped zinc oxide thin films.

[Key To The Numbers]

1 Spray bottle
2 Substrate holder (with heater)
3 Spray nozzle
4 Compressor
5 Alkali-free substrate
6 Water vapor introduction tube

The invention claimed is:

1. A composition for manufacturing a zinc oxide thin film, comprising a product obtained by a first process or a second process, the first process comprising: adding water to a solution S1 that is obtained by dissolving an organic zinc compound denoted by general formula (1) below in an electron-donating organic solvent to partially hydrolyze the organic zinc compound to obtain a partially hydrolyzed product comprising a compound denoted by general formula (2') or a mixture of the compounds denoted by general formula (2') with different values of m, $$R^1—Zn—R^1 \quad (1)$$

wherein R¹ denotes a linear or branched alkyl group having 1 to 7 carbon atoms;

$$R^1—Zn—[O—Zn]_m—R^1 \quad (2')$$

where R¹ is as defined in general formula (1) and m denotes an integer of from 2 to 20;

wherein said electron donating organic solvent is an electron donating organic solvent having a boiling point of 110° C. or higher or a mixed organic solvent containing an electron donating organic solution having a boiling point of 110° C. or higher as a principal component.

2. The composition according to claim 1, wherein the water is added to the solution S1 such that the molar ratio relative to the organic zinc compound falls within a range of 0.6 to 0.9 to suppress production of gel.

3. The composition according to claim 1, wherein the organic zinc compound is a compound in which R¹ denotes an alkyl group with 1, 2, 3, 4, 5, or 6 carbon atoms.

4. The composition according to claim 1, wherein the organic zinc compound is diethylzinc.

5. A composition for manufacturing a zinc oxide thin film, comprising a product obtained by a first process or a second process, the first process comprising: adding water to a solution S1 that is obtained by dissolving an organic zinc compound denoted by general formula (1) below in an electron-donating organic solvent to partially hydrolyze the organic zinc compound to obtain a partially hydrolyzed product comprising a compound denoted by general formula (2') or a mixture of the compounds denoted by general formula (2') with different values of m, $$R^1—Zn—R^1 \quad (1)$$

wherein R¹ denotes a linear or branched alkyl group having 1 to 7 carbon atoms;

$$R^1—Zn—[O—Zn]_m—R^1 \quad (2')$$

where R¹ is as defined in general formula (1) and m denotes an integer of from 2 to 20;

wherein said electron donating organic solvent is an electron donating organic solvent having a boiling point of 110° C. or higher or a mixed organic solvent containing an electron donating organic solution having a boiling point of 110° C. or higher as a principal component; and wherein the composition is comprised of a solution obtained by separating the partially hydrolyzed product from the electron-donating organic solvent and by dissolving the partially hydrolyzed product separated from the electron-donating organic solvent in an organic solvent for forming a thin film that is different from the electron-donating organic solvent.

6. The composition according to claim 5, wherein the concentration of the partially hydrolyzed product falls within a range of 3 to 12 mass % in the organic solvent for forming a thin film.

7. The composition according to claim 5, wherein the water is added to the solution S1 such that the molar ratio relative to the organic zinc compound falls within a range of 0.6 to 0.9 to suppress production of gel.

8. The composition according to claim 1 or claim 5, wherein said solution S1 is a solution obtained by dissolving the organic zinc compound denoted by general formula (1) to a concentration falling within a range of 4 to 12 mass %; and the quantity of added water falls within a range of a molar ratio of 0.4 to 0.8 relative to the organic zinc compound.

9. The composition according to claim 8, wherein the boiling point of the electron-donating organic solvent is 230° C. or lower.

10. The composition according to claim 8, wherein the mixed organic solvent is a mixed solvent of 1,2-diethoxyethane and tetrahydrofuran.

* * * * *